United States Patent
Huang et al.

(10) Patent No.: US 10,741,127 B2
(45) Date of Patent: Aug. 11, 2020

(54) DISPLAY PANEL INCLUDING ANTENNA STRUCTURE COMPENSATING LOADING OF SCAN LINE DUE TO CROSSOVER AREAS OF ANTENNA STRUCTURE

(71) Applicant: a.u. Vista, Inc., Milpitas, CA (US)

(72) Inventors: Yu-Sheng Huang, Hsinchu (TW); Sheng-Miao Huang, Hsinchu (TW); BoWei Chen, Hsinchu (TW)

(73) Assignee: A.U. VISTA, INC., Milpitas, CA (US)

( * ) Notice: Subject to any disclaimer, the term of this patent is extended or adjusted under 35 U.S.C. 154(b) by 17 days.

(21) Appl. No.: 16/287,124

(22) Filed: Feb. 27, 2019

(65) Prior Publication Data

US 2020/0020288 A1 Jan. 16, 2020

Related U.S. Application Data

(60) Provisional application No. 62/696,031, filed on Jul. 10, 2018.

(51) Int. Cl.
*G09G 3/3258* (2016.01)
*H01L 27/12* (2006.01)
(Continued)

(52) U.S. Cl.
CPC ......... *G09G 3/3258* (2013.01); *G02F 1/1368* (2013.01); *G02F 1/13452* (2013.01); *G02F 1/136286* (2013.01); *G09G 3/2003* (2013.01); *G09G 3/32* (2013.01); *G09G 3/3614* (2013.01); *G09G 3/3659* (2013.01); *G09G 3/3677* (2013.01); *H01L 25/167* (2013.01); *H01L 27/1218* (2013.01); *H01L 27/326* (2013.01); *H01L 27/3211* (2013.01);
(Continued)

(58) Field of Classification Search
CPC ...... G02F 1/136286; G09G 2300/0426; G09G 2300/0439; G09G 2300/0478; G09G 3/36; G09G 3/3611; G09G 3/3614; G09G 3/3625; G09G 3/364; G09G 3/3644; G09G 3/3648; G09G 3/3655; G09G 3/3659; G09G 3/3666; G09G 3/3677
USPC .................................................. 345/87–104
See application file for complete search history.

(56) References Cited

U.S. PATENT DOCUMENTS 5,844,535 A 12/1998 Itoh et al.
6,856,297 B1 2/2005 Durham et al.
(Continued)

*Primary Examiner* — Alexander Eisen
*Assistant Examiner* — Nelson Lam
(74) *Attorney, Agent, or Firm* — Tim Tingkang Xia, Esq.; Locke Lord LLP

(57) ABSTRACT

A display panel includes a pixel structure corresponding to a display area, and a receiver antenna structure disposed on the pixel structure. The receiver antenna structure includes multiple antenna blocks. Each antenna block includes an antenna, and two diodes are connected in parallel to the antenna and disposed in opposite directions. The diodes are connected to two switches provided with two clock pulse signals phase-inversed from each other. For each pixels, the switches alternately turns on and off in consecutive frames, allowing the pixels to be driven in a driving dot inversion driving mode. Further, the scan lines extending and crossing over the antennas may have crossover portions the common electrode, and a width of the crossover portion of each scan line may be adjusted to compensate the loading of the scan line due to crossover areas with the antennas.

20 Claims, 26 Drawing Sheets

(51) Int. Cl.
- *H05K 1/02* (2006.01)
- *H01Q 1/24* (2006.01)
- *G02F 1/1345* (2006.01)
- *G02F 1/1362* (2006.01)
- *G02F 1/1368* (2006.01)
- *G09G 3/32* (2016.01)
- *G09G 3/36* (2006.01)
- *H01L 25/16* (2006.01)
- *G09G 3/20* (2006.01)
- *H01L 27/32* (2006.01)

(52) U.S. Cl.
CPC .......... H01L 27/3276 (2013.01); H01Q 1/24 (2013.01); H05K 1/0213 (2013.01); *G09G 2300/0408* (2013.01); *G09G 2300/0426* (2013.01); *G09G 2300/0439* (2013.01); *G09G 2300/0814* (2013.01); *G09G 2300/0885* (2013.01); *G09G 2320/0219* (2013.01); *G09G 2370/16* (2013.01); *H01L 27/1255* (2013.01)

(56) References Cited

U.S. PATENT DOCUMENTS

| | | | |
|---|---|---|---|
| 10,033,102 B2 | 7/2018 | Uraki et al. | |
| 10,276,088 B2* | 4/2019 | Li | G09G 3/22 |
| 10,553,173 B2* | 2/2020 | Huang | G09G 3/3688 |
| 10,636,360 B2* | 4/2020 | Hsu | H05K 1/0213 |
| 10,679,563 B2* | 6/2020 | Cho | H01L 25/167 |
| 2012/0068984 A1* | 3/2012 | Chen | G06F 3/0412 |
| | | | 345/211 |
| 2014/0106684 A1 | 4/2014 | Burns et al. | |
| 2018/0190182 A1* | 7/2018 | Li | G09G 3/22 |
| 2018/0220540 A1* | 8/2018 | Suzuki | H05K 5/0017 |
| 2018/0261152 A1* | 9/2018 | Singh | G09G 3/3266 |
| 2018/0301106 A1* | 10/2018 | Huang | G09G 3/3688 |
| 2019/0250470 A1* | 8/2019 | Huang | G02F 1/133345 |
| 2020/0020272 A1* | 1/2020 | Huang | H01Q 21/061 |
| 2020/0020276 A1* | 1/2020 | Cho | H01L 27/1218 |
| 2020/0020749 A1* | 1/2020 | Hsu | G02F 1/1368 |
| 2020/0020751 A1* | 1/2020 | Cho | G09G 3/3677 |

* cited by examiner

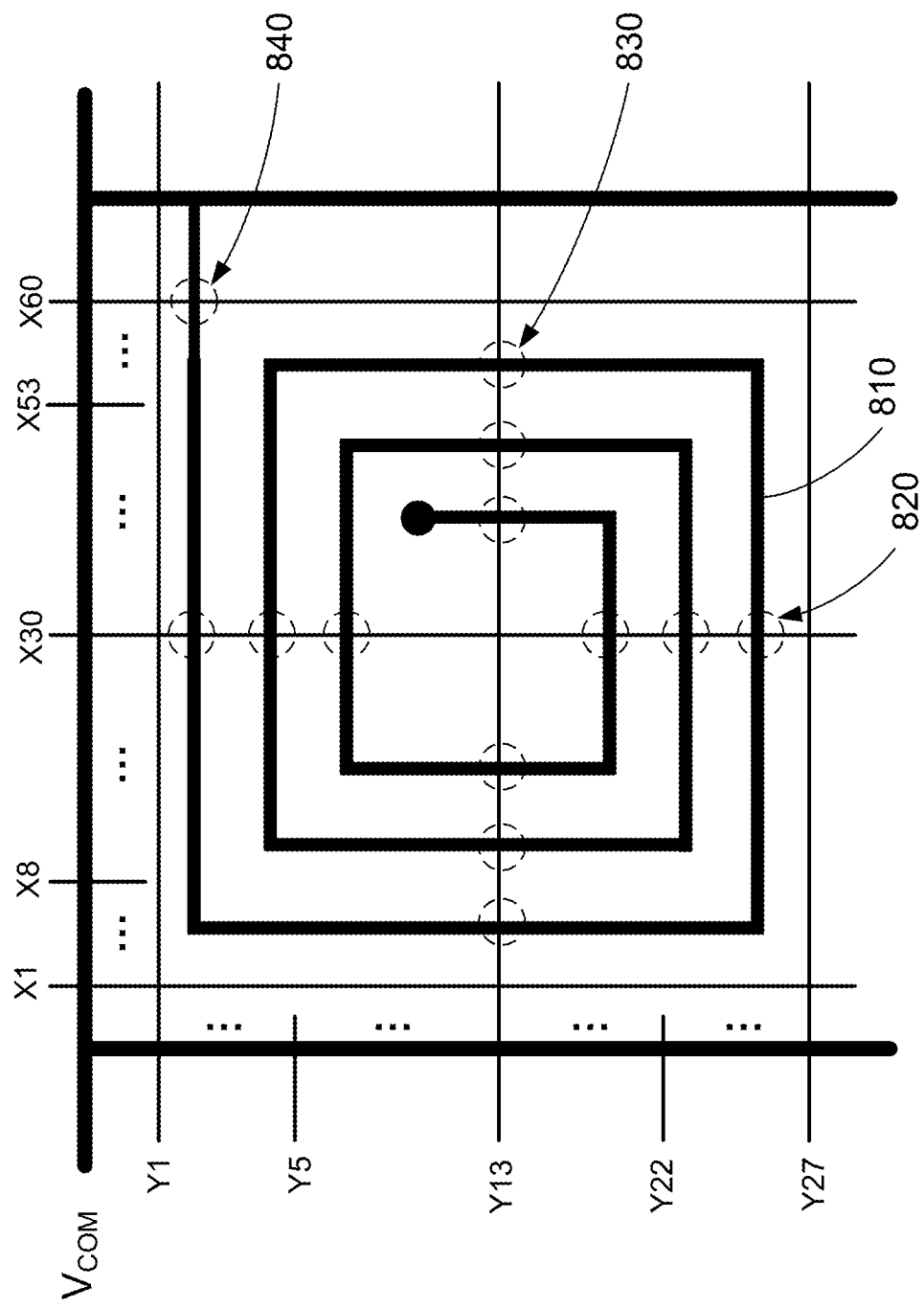

DISPLAY PANEL INCLUDING ANTENNA STRUCTURE COMPENSATING LOADING OF SCAN LINE DUE TO CROSSOVER AREAS OF ANTENNA STRUCTURE

CROSS-REFERENCE TO RELATED PATENT APPLICATION

This non-provisional application claims priority to and the benefit of, pursuant to 35 U.S.C. § 119(e), U.S. provisional patent application Ser. No. 62/696,031 filed Jul. 10, 2018. The disclosure of the above application is incorporated herein in its entirety by reference.

FIELD

The disclosure relates generally to display technology, and more particularly to a display device having antenna and scan line designs for dot inversion and loading compensation.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, wireless transmission technology has been used for transmitting signals in a display panel. Generally, a display panel may include a peripheral non-display area, which is reserved for a plurality of integrated circuits (ICs), as the data drivers that provide data signals to the pixels of the display panel. In order to reduce or eliminate the peripheral non-display area, wireless transmission technology may be used to transmit the data signals, thus achieving high speed data transmission and reducing the resistive-capacitive (RC) delay issues.

However, in a liquid crystal display (LCD) device utilizing the wireless transmission technology, RC loading may be significant in the LCD device with a larger size (such as over 85") and high resolution (over 8K), and there is no existing antenna design that allows a dot inversion driving mode for the pixels. Further, in a display panel with multiple scan lines to provide scan signals to the pixels, the scan lines may have crossover areas with the receiver antennas, thus increasing the loading of the scan lines. Since each scan line has a different corresponding location relative to the receiver antennas, the loading increase for each scan line may be different, causing a significant loading difference between scan lines.

Therefore, a heretofore unaddressed need exists in the art to address the aforementioned deficiencies and inadequacies.

SUMMARY

One aspect of the disclosure relates to a display panel, including: a pixel structure corresponding to a display area, comprising a plurality of pixels; and a receiver antenna structure disposed on the pixel structure, configured to provide first signals to the pixels in a dot inversion driving mode, wherein the receiver antenna structure comprises a plurality of antenna blocks, each of the antenna blocks corresponds to M*N pixels of the pixels, the M*N pixels are disposed in M columns and N rows, and M and N are positive integers; wherein each of the antenna blocks includes: an antenna, having an inner feeding end and an outer feeding end, wherein one of the inner feeding end and the outer feeding end functions as a feeding end, and the other of the inner feeding end and the outer feeding end is electrically connected to a direct voltage level to function as a reference end; a first diode and a second diode electrically connected to the feeding end of the antenna in parallel, wherein the first diode and the second diode are disposed in opposite directions; a first switch electrically connecting the first diode to the M*N pixels, wherein a control end of the first switch is electrically connected to a first clock pulse signal; and a second switch electrically connecting the second diode to the M*N pixels, wherein a control end of the second switch is electrically connected to a second clock pulse signal phase-inversed from the first clock pulse signal; wherein for each of the M*N pixels, in a first frame, the first switch is turned on and the second switch is turned off; and in a second frame, the first switch is turned off and the second switch is turned on.

In certain embodiments, each of the antenna blocks further comprises a bridge structure electrically connecting the M*N pixels to the first switch and the second switch respectively, the bridge structure has a main line electrically connected to the first switch and the second switch respectively, and a plurality of branch lines extending from the main line along a row direction to be electrically connected to the M*N pixels.

In certain embodiments, the display panel further includes a common electrode, wherein the reference end of the antenna of each of the antenna blocks is electrically connected to the common electrode to receive the direct voltage level from the common electrode.

In certain embodiments, the display panel further includes a plurality of scan lines extending and crossing over the antennas of the antenna blocks, wherein the antennas of the antenna blocks have a plurality of antenna crossover areas overlapping with the scan lines in a vertical direction perpendicular to the pixel structure, and each of the scan lines has a crossover portion overlapping with the common electrode in the vertical direction, and a width of the crossover portion of each of the scan lines is greater than or equal to a width of a remaining portion of each of the scan lines.

In certain embodiments, the scan lines comprise a first scan line corresponding to a first quantity of the antenna crossover areas and a second scan line corresponding to a second quantity of the antenna crossover areas, the second quantity is greater than the first quantity, and a width of the crossover portion of the first scan line is greater than a width of the crossover portion of the second scan line.

In certain embodiments, the scan lines further comprise a third scan line corresponding to a third quantity of the antenna crossover areas, the third quantity is greater than the first quantity and less than the second quantity, and a width of the crossover portion of the third scan line is greater than the width of the crossover portion of the second scan line and is less than the width of the crossover portion of the first scan line.

In certain embodiments, the width of the crossover portion of each of the scan lines is determined by a total crossover area of the antenna crossover areas corresponding to each of the scan lines.

In certain embodiments, each of the pixels comprises a plurality of scan switches, and a control end of each of scan switches is electrically connected to a corresponding one of the scan lines.

In certain embodiments, the display panel further includes a plurality of common electrodes, wherein the reference end of the antenna of each of the antenna blocks is electrically connected to one of the common electrodes, and each of the common electrodes is provided with a corresponding direct voltage level.

In certain embodiments, two adjacent antenna blocks of the antenna blocks are electrically connected to two different ones of the common electrodes respectively.

In certain embodiments, the display panel further includes a plurality of scan lines and a plurality of gate drivers electrically connected to the scan lines, wherein at least one of the gate drivers is disposed in the display area between two adjacent ones of the antenna blocks.

In another aspect of the disclosure, a display panel includes: a pixel structure corresponding to a display area, comprising a plurality of pixels; a receiver antenna structure disposed on the pixel structure, configured to provide first signals to the pixels, wherein the receiver antenna structure comprises a plurality of antennas; a plurality of scan lines extending and crossing over the antennas, wherein the antennas have a plurality of antenna crossover areas overlapping with the scan lines in a vertical direction perpendicular to the pixel structure; and a common electrode, wherein each of the scan lines has a crossover portion overlapping with the common electrode in the vertical direction; wherein a width of the crossover portion of each of the scan lines is greater than or equal to a width of a remaining portion of each of the scan lines; wherein the scan lines comprise a first scan line corresponding to a first quantity of the antenna crossover areas and a second scan line corresponding to a second quantity of the antenna crossover areas, the second quantity is greater than the first quantity, and a width of the crossover portion of the first scan line is greater than a width of the crossover portion of the second scan line.

In certain embodiments, the scan lines further comprise a third scan line corresponding to a third quantity of the antenna crossover areas, the third quantity is greater than the first quantity and less than the second quantity, and a width of the crossover portion of the third scan line is greater than the width of the crossover portion of the second scan line and is less than the width of the crossover portion of the first scan line.

In certain embodiments, the width of the crossover portion of each of the scan lines is determined by a total crossover area of the antenna crossover areas corresponding to each of the scan lines.

In certain embodiments, for a center scan line of the scan lines corresponding to a maximum quantity of the antenna crossover areas, a width of the crossover portion of the center scan lines is equal to a width of a remaining portion of the center scan line.

In certain embodiments, the common electrode comprises a plurality of strip portions disposed around the antennas, each of the strip portions has a plurality of overlapping portions corresponding to the crossover portions of the scan lines, and a width of each of the overlapping portions is greater than a width of a remaining portion of each of the strip portions.

In certain embodiments, the scan lines comprise a plurality of X scan lines extending along a column direction and a plurality of Y scan lines extending along a row direction.

In certain embodiments, the receiver antenna structure comprises a plurality of antenna blocks, each of the antenna blocks corresponds to M*N pixels of the pixels, the M*N pixels are disposed in M columns and N rows, M and N are positive integers, and each of the antenna blocks comprises: a corresponding antenna of the antennas, the corresponding antenna having an inner feeding end and an outer feeding end, wherein one of the inner feeding end and the outer feeding end functions as a feeding end, and the other of the inner feeding end and the outer feeding end is electrically connected to the common voltage to receive a direct voltage level to function as a reference end; a first diode and a second diode electrically connected to the feeding end of the corresponding antenna in parallel, wherein the first diode and the second diode are disposed in opposite directions; a first switch electrically connecting the first diode to the M*N pixels, wherein a control end of the first switch is electrically connected to a first clock pulse signal; and a second switch electrically connecting the second diode to the M*N pixels, wherein a control end of the second switch is electrically connected to a second clock pulse signal phase-inversed from the first clock pulse signal; wherein for each of the M*N pixels, in a first frame, the first switch is turned on and the second switch is turned off; and in a second frame, the first switch is turned off and the second switch is turned on.

In certain embodiments, each of the antenna blocks further comprises a bridge structure electrically connecting the M*N pixels to the first switch and the second switch respectively, the bridge structure has a main line electrically connected to the first switch and the second switch respectively, and a plurality of branch lines extending from the main line along a row direction to be electrically connected to the M*N pixels.

In certain embodiments, the display panel further includes a plurality of gate drivers electrically connected to the scan lines, wherein at least one of the gate drivers is disposed in the display area between two adjacent ones of the antenna blocks.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 5C schematically shows voltage transmission for the pixel as shown in FIG. 5A in a first frame as shown in FIG. 5B according to certain embodiments of the present disclosure, where the odd clock pulse signal is on.

FIG. 5D schematically shows voltage transmission for the pixel as shown in FIG. 5A in a second frame as shown in FIG. 5B according to certain embodiments of the present disclosure, where the even clock pulse signal is on.

FIG. 8A schematically shows the crossover areas between a receiver antenna and a plurality of scan lines according to certain embodiments of the present disclosure.

DETAILED DESCRIPTION OF THE DISCLOSURE

Figure 1A:
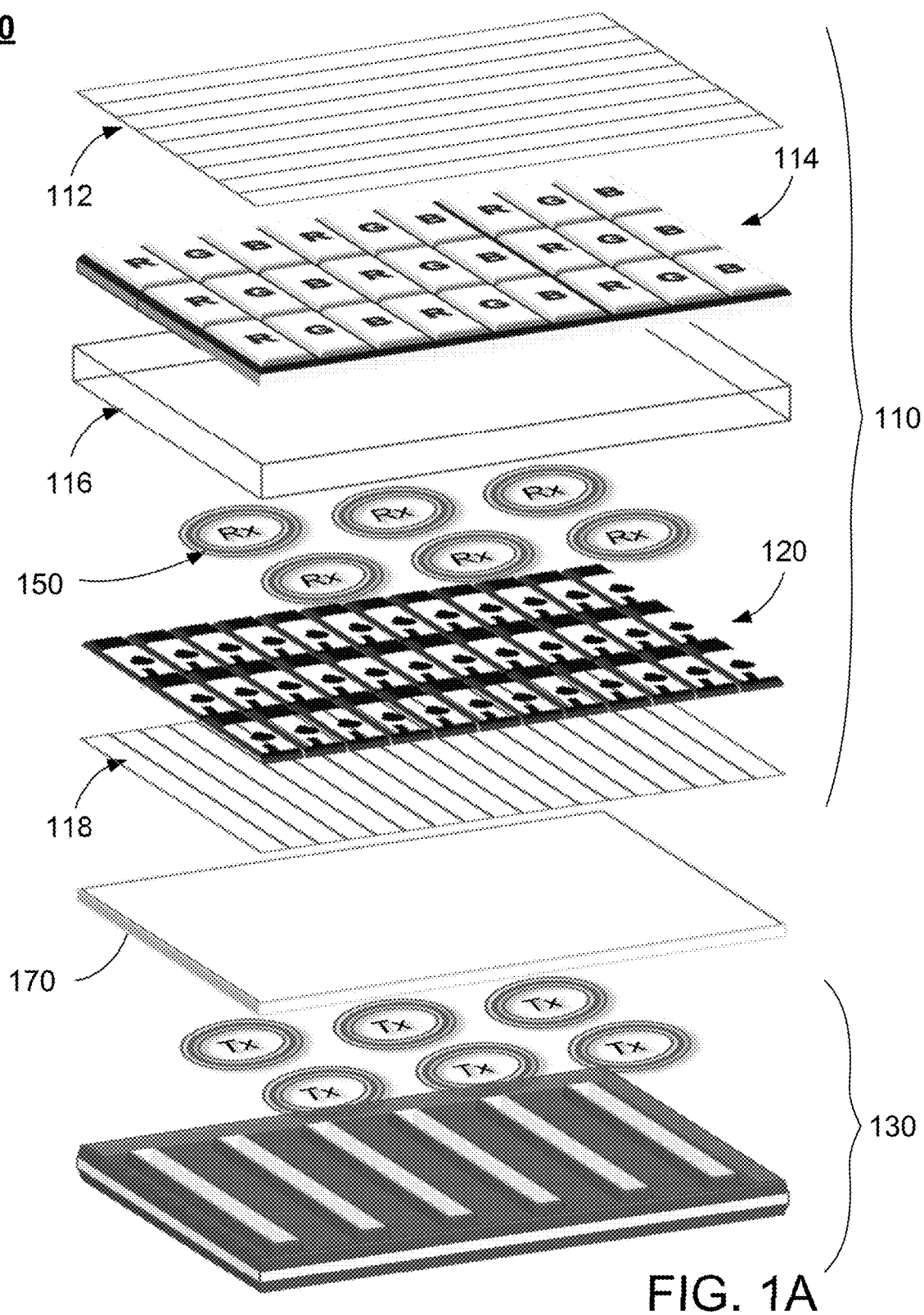
FIG. 1A schematically shows an exploded view of a display panel of a display device according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the "feeding end" of a receiver antenna refers to the "actual" feeding end being electrically connected to a corresponding signal line. Generally, a receiver antenna has an outer feeding end and an inner feeding end, where one of the outer feeding end and the inner feeding end serves as the "feeding end" and the other of the outer feeding end and the inner feeding end is grounded or electrically connected to a reference voltage level (such as the common voltage $V_{COM}$ provided by a common electrode).

The description will be made as to the embodiments of the present disclosure in conjunction with the accompanying drawings. In accordance with the purposes of this disclosure, as embodied and broadly described herein, this disclosure, in certain aspects, relates to a display panel and a display device using the same for wireless data transmission.

As described above, a display panel may adopt a wireless transmission mechanism to achieve high speed data transmission. In one example, magnetic coupling antennas may be used as transmitters and receivers to facilitate wireless transmission. For example, when a transmitter antenna Tx is provided with a current, the transmitter antenna Tx may generate a magnetic field, which causes a corresponding receiver antenna Rx to generate an induced current. Thus, the signal is transmitted from the transmitter antenna Tx to the corresponding receiver antenna Rx . . . . However, since a larger display device is required, a severe voltage drop by current (also known as the "IR drop") problem might occur in the data line transmission. Therefore, the present disclosure proposes a block driving mechanism to solve the IR drop problem by separating the display panel into different block zones and driving each block zone individually using different receiver antennas. Further, a tiled display apparatus is also proposed.

FIG. 1A schematically shows an exploded view of a display panel according to certain embodiments of the present disclosure. As shown in FIG. 1A, the display panel 100 is a color liquid crystal display (LCD) panel, which includes a display cell 110, a transmitter antenna structure 130, a receiver antenna structure 150 and a backlight module 170. The display cell 110 includes, from the image display side (top side of FIG. 1) toward a backlight side (bottom side of FIG. 1), a first polarizer 112, a color filter layer 114, a liquid crystal layer 116, a thin-film transistor (TFT) array 120 and a second polarizer 118. The receiver antenna structure 150 is formed by a plurality of receiver antennas Rx and is disposed on the TFT array 120. The transmitter antenna structure 150 is formed by a plurality of transmitter antennas Tx and is disposed on the backlight module 170, such that a distance exists between the transmitter antenna structure 130 and the receiver antenna structure 150 to facilitate high speed wireless data transmission between the transmitter antenna structure 130 and the receiver antenna structure 150.

In the display cell 110, the TFT array 120, the liquid crystal layer 116 and the color filter layer 114 correspondingly define a pixel structure, which corresponds to a display area of the display panel 100. Specifically, the pixel structure includes a plurality of pixels arranged in an array having M columns and N rows, where M and N are positive integers. For each pixel of the pixel structure, a corresponding TFT in the TFT array 120 and a corresponding set of color filters in the color filter layer 114 are provided.

In certain embodiments, the display panel 100 may include other layers or structures not shown in FIG. 1A. For example, multiple insulating films or layers may be provided in the pixel structure (i.e., the TFT array 120, the liquid crystal layer 116 and the color filter layer 114).

Figure 1B:
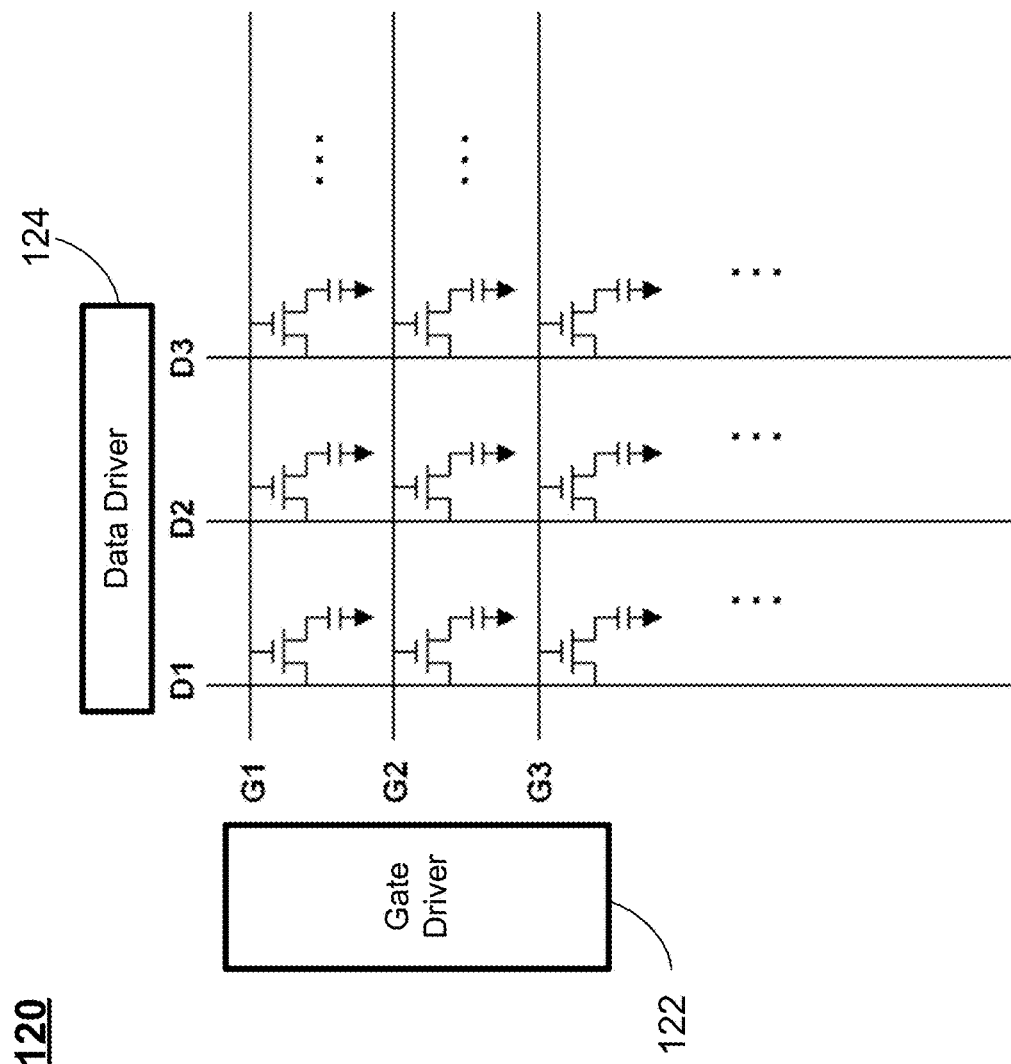
FIG. 1B schematically shows a part of a TFT array according to certain embodiments of the present disclosure.

FIG. 1B schematically shows a part of a TFT array according to certain embodiments of the present disclosure. As shown in FIG. 1B, the TFT array 120 includes a plurality of TFTs arranged in an array, where each of the TFT corresponds to a pixel of the pixel structure. In other words, for the pixel structure that includes a plurality of pixels arranged in an array having M columns and N rows, the TFT array 120 also includes a plurality of TFTs arranged in an array having M columns and N rows. Further, a plurality of data lines D1, D2, D3 . . . and a plurality of gate lines G1, G2, G3 . . . are provided in the pixel structure. Each of the data lines D1, D2, D3 is electrically connected to the sources of the TFTs in a corresponding column, and each of the gate lines G1, G2, G3 is electrically connected to the gates of the TFTs in a corresponding row. A gate driver 122 is connected to the gate lines G1, G2, G3 for providing gate signals to the gate lines, and a data driver 124 is connected to the data lines D1, D2, D3 for providing data signals to the data lines. In certain embodiments, the gate driver 122 and the data driver 124 are respectively provided at the border area of the display panel. In certain embodiments, multiple gate drivers 122 may be provided. In certain embodiments, multiple data drivers 124 may be provided.

Figure 2B:
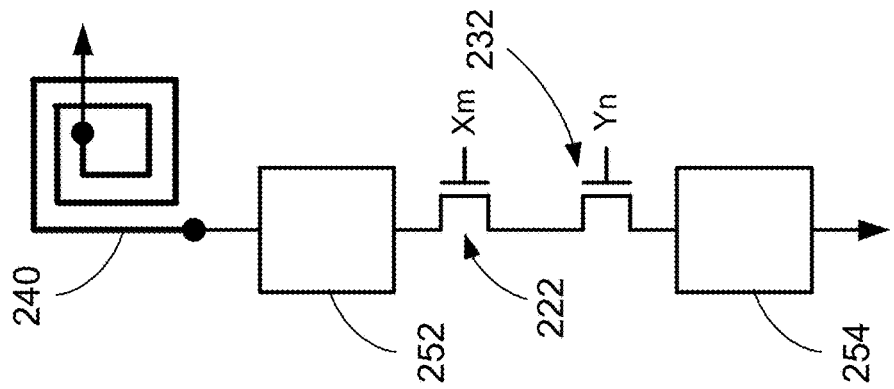
FIG. 2B schematically shows the connections between a receiver antenna, the pixel circuit of a pixel, and a plurality of scan transistor switches corresponding to the pixel according to certain embodiments of the present disclosure.
Figure 2A:
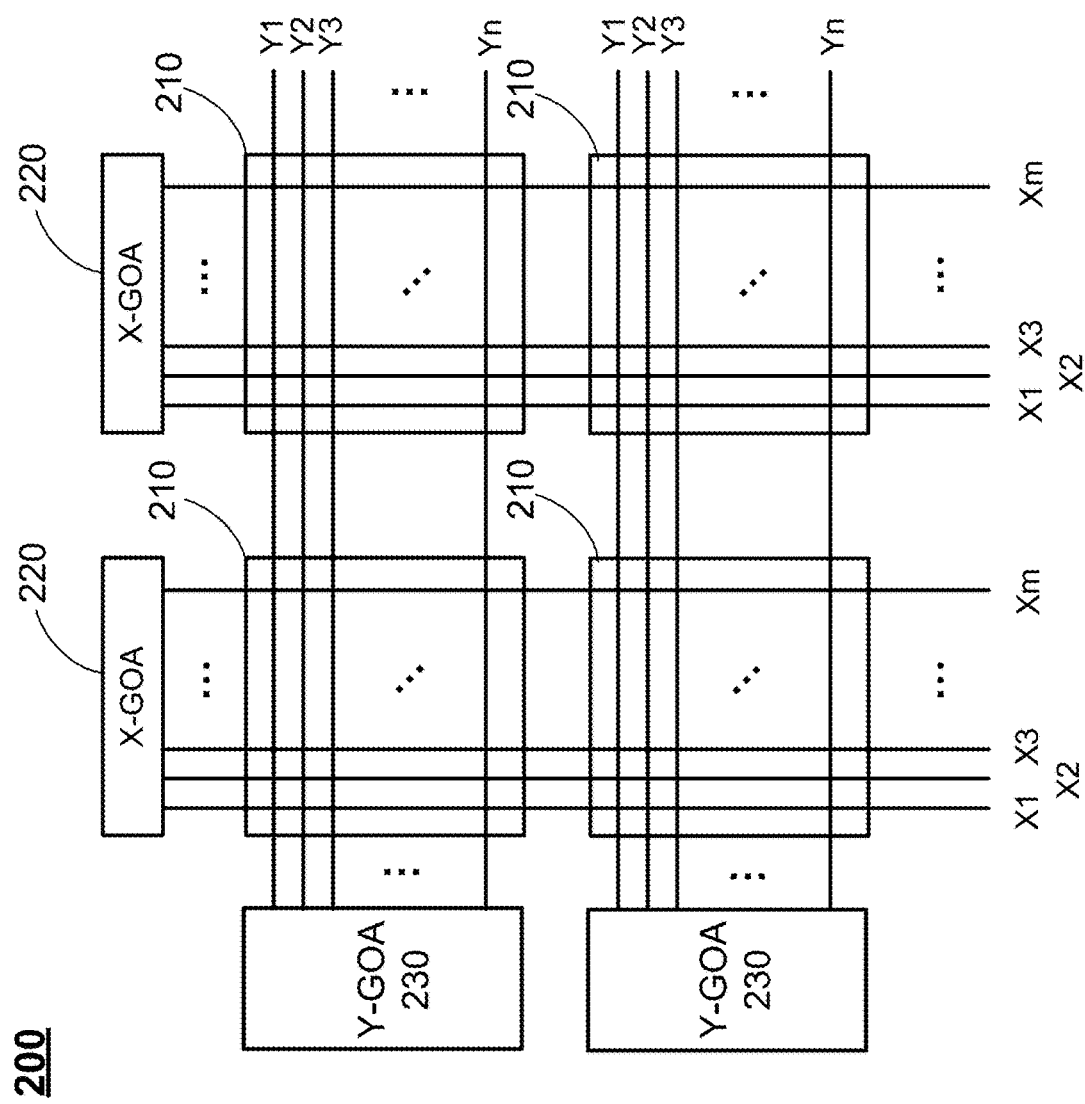
FIG. 2A schematically shows the connections between a matrix of receiver antenna groups in a receiver antenna structure and corresponding scan lines according to certain embodiments of the present disclosure.

FIG. 2A schematically shows the connections between a matrix of receiver antenna groups in a receiver antenna structure and corresponding scan lines according to certain embodiments of the present disclosure. As shown in FIG. 2A, the pixel structure 200 are divided into a plurality of receiver antenna groups 210, where each receiver antenna group 210 includes m*n pixels corresponding to a same receiver antenna (not shown in FIG. 2A) to transmit the data signal to the m*n pixels, where m and n are positive integers. Further, at a peripheral area of the pixel structure 200, multiple gate drivers on array (GOAs) 220 and 230 are respectively arranged in along the row direction and the column direction as shown in FIG. 2A. Specifically, each X-GOA 220 represents a GOA located at the top side of FIG. 2A, which is electrically connected to m scan lines X1, X2, X3, . . . Xm extending in the column direction (i.e. the X direction); and each Y-GOA 230 represents a GOA located at the left side of FIG. 2A, which is electrically connected to n scan lines Y1, Y2, Y3, . . . Yn extending in the row direction (in the Y direction). In this case, for each of the pixels corresponding to one of the receiver antenna groups 210, the pixel circuit of the pixel may include multiple scan transistors or switches, where at least one of the scan transistors is controlled by a scan signal transmitted through a corresponding one of the m scan lines X1, X2, X3, . . . Xm in the X direction, and at least one of the scan transistors is controlled by a scan signal transmitted through a corresponding one of the n scan lines Y1, Y2, Y3, . . . Yn in the Y direction, such that the pixel may be controlled by the scan signals to receive the data signal being transmitted by the corresponding receiver antenna.

FIG. 2B schematically shows the connections between a receiver antenna, the pixel circuit of a pixel, and a plurality of scan transistor switches corresponding to the pixel according to certain embodiments of the present disclosure. As shown in FIG. 2B, a receiver antenna 240 is electrically connected to a pixel circuit of the pixel, which includes a X scan transistor 222, a Y scan transistor 232, and two circuit modules 252 and 254 being in a series connection. Generally, a pixel circuit may include circuitry components such as transistors, capacitors, diodes or other circuits, and the connections between these circuitry components may vary. Thus, the two circuit modules 252 and 254 are merely shown as two blocks, without showing the detailed circuitry components of each of the circuit modules. Specifically, FIG. 2B shows that the X scan transistor 222 is connected to the scan line Xm, and the Y scan transistor 232 is electrically connected to the scan line Yn. In other words, the pixel as shown in FIG. 2B is a pixel that corresponds to the scan lines Xm and Yn as shown in FIG. 2A.

It should be noted that, although FIG. 2B shows the X scan transistor 222, the Y scan transistor 232, and two circuit modules 252 and 254 are in a series connection, the connections between the X scan transistor 222, the Y scan transistor 232, and two circuit modules 252 and 254 may also vary and are thus not limited thereto.

Figure 3:
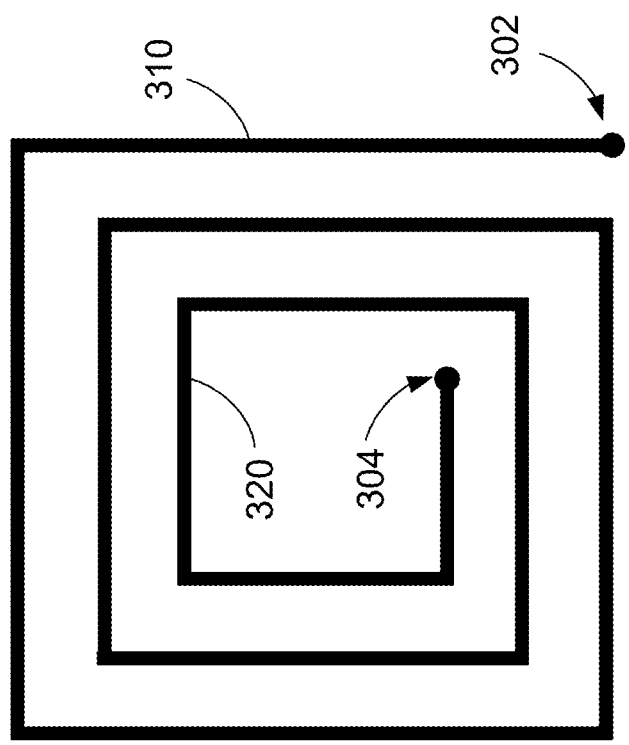
FIG. 3 schematically shows a top view of an antenna according to certain embodiments of the present disclosure.

FIG. 3 schematically shows an antenna according to certain embodiments of the disclosure. Specifically, the antenna 300 as shown in FIG. 3 can be used as a receiver antenna Rx in the receiver antenna structure 150 as shown in FIG. 1A. As shown in FIG. 3, the antenna 300 is winding from an outer feeding end 302 inward to an inner feeding end 304 in a counter-clockwise direction. In certain embodiments, the winding direction of the antenna 200 can be either clockwise or counter-clockwise. Further, and the antenna 300 includes a plurality of vertical segments 310 and horizontal segments 320, forming a plurality of turns of wires. As shown in FIG. 3, the winding number of the antenna 300 has a winding number N=3, indicating that the antenna 300 has three turns of wires. In certain embodiments, the winding number N of the antenna 300 may be determined based on the desired transmission characteristics of the antenna 300.

In certain embodiments, the transmission characteristics of an antenna may be described in the form of an induced decibel (dB), which reflects the transmission performance of the antenna. In the wireless transmission field, the value of the induced dB of an antenna indicates a ratio Rx/Tx, which refers to the ratio of the receiver antenna Rx to the transmitter antenna Tx of the antenna. For example, if a power ratio of the Rx/Tx is X, the amplitude ratio of the Rx/Tx is $(X)^{1/2}$, and the induced dB of the antenna is $10*\log_{10} X$. Generally, an antenna having an induced dB that is greater than −10 dB indicates an acceptable performance for the wireless transmission of the antenna, and an antenna having an induced dB that is close to 0 dB indicates an excellent performance (i.e., minimum transmission loss) for the wireless transmission of the antenna.

Referring back to FIG. 2B, the receiver antenna 240 is electrically connected to the pixel circuit of the pixel at its outer feeding end of the receiver antenna 240. In certain embodiments, the receiver antenna can be electrically connected to the corresponding data line at either one of the outer feeding end and the inner feeding end thereof. In this case, the other of the outer feeding end and the inner feeding end of the receiver antenna which is not being electrically connected to the corresponding data line may be grounded, or may be electrically connected to a reference voltage level (such as a direct voltage level as a common voltage $V_{COM}$ provided by a common electrode, or other reference voltage levels such as $V_{SS}$ or $V_{DD}$ signals).

As discussed above, in a LCD device utilizing the wireless transmission technology, RC loading may be significant in the LCD device with a larger size (such as over 85") and high resolution (over 8K), and there is no existing antenna design that allows a dot inversion driving mode for the pixels. To remedy this deficiency, one aspect of the present disclosure provides a display panel, which may implement dot inversion with the receiver antenna and corresponding pixel design.

Figure 4A:
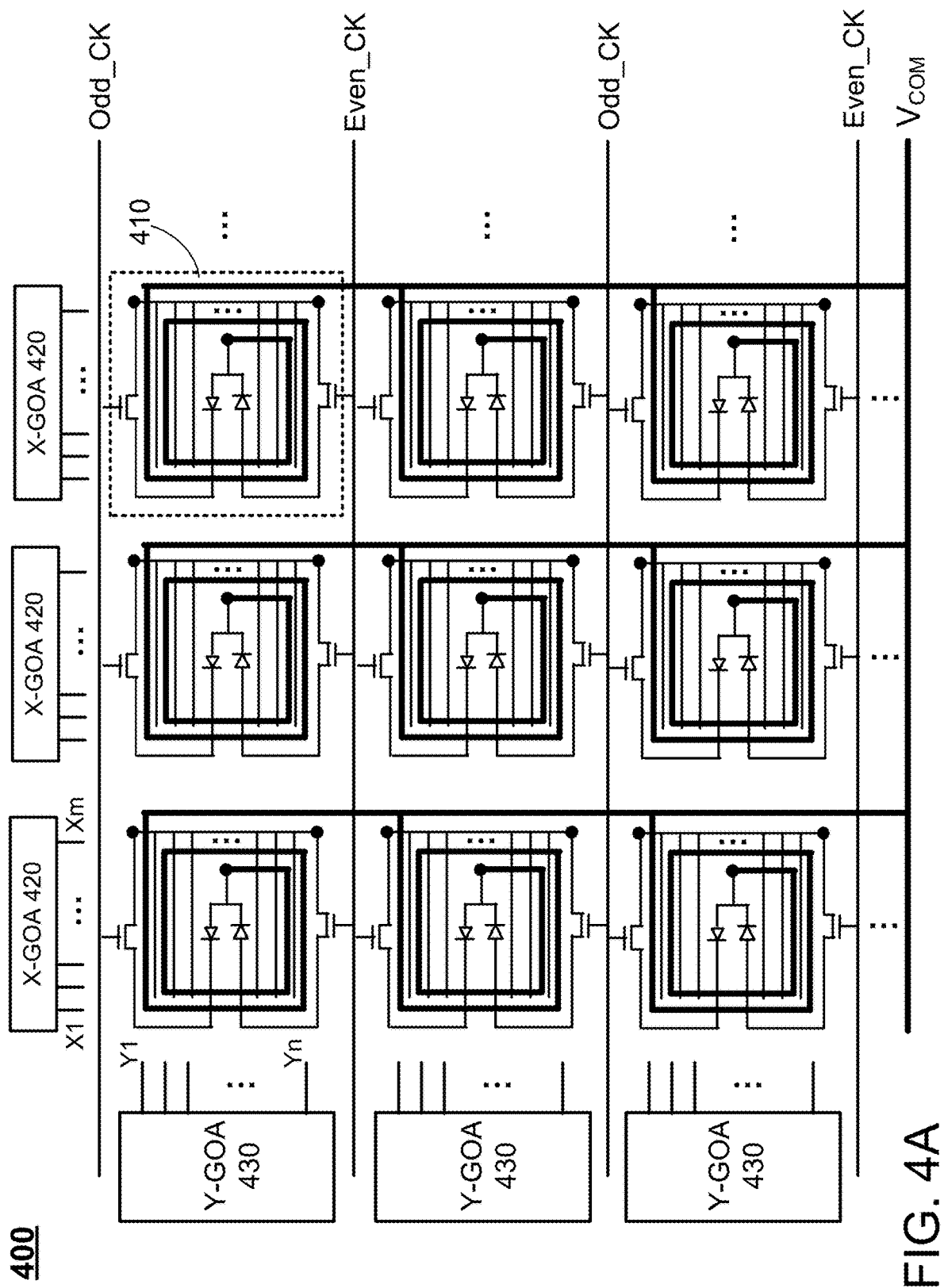
FIG. 4A schematically shows a plurality of antenna blocks of the receiver antenna structure according to certain embodiments of the present disclosure.
Figure 4B:
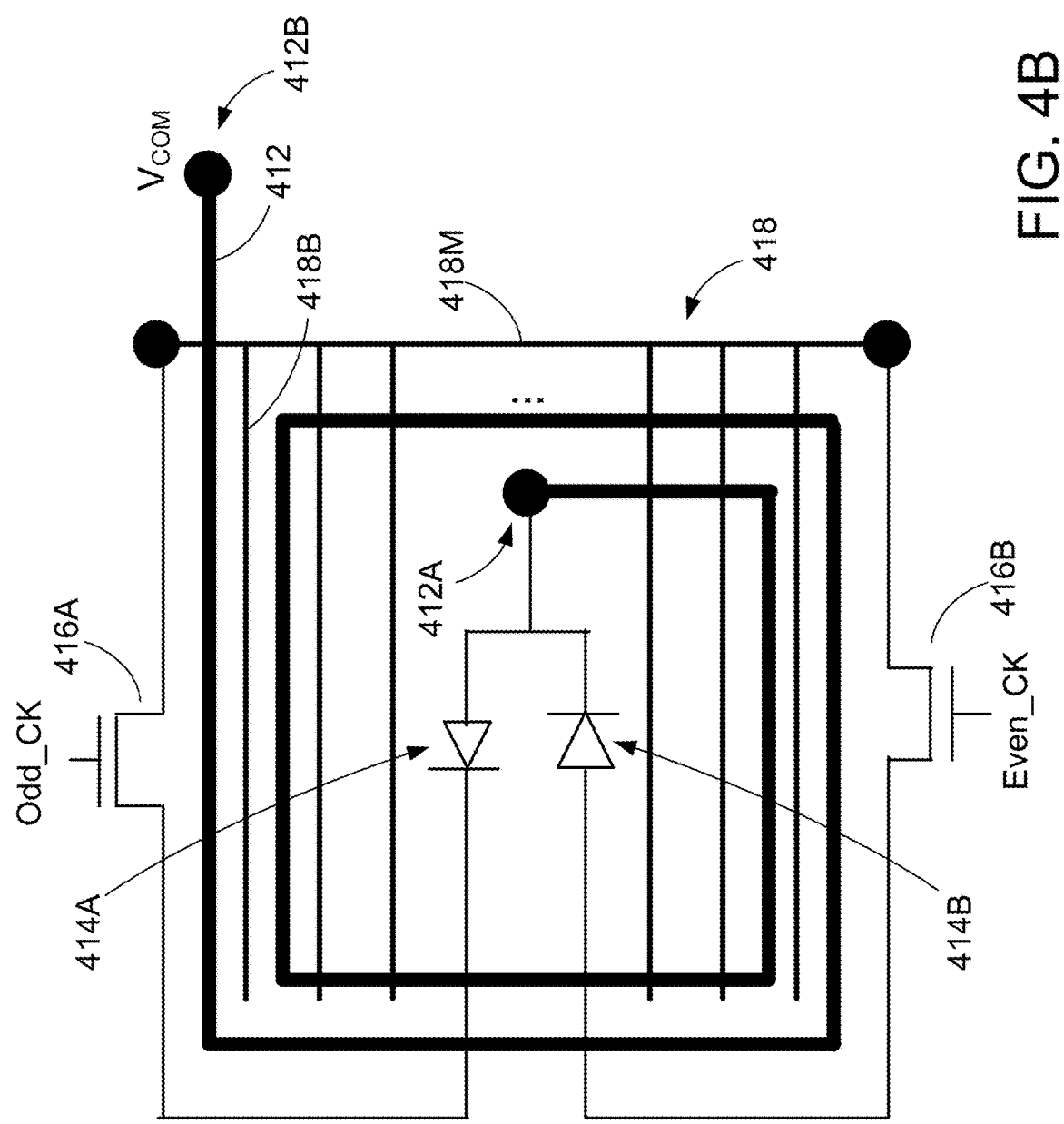
FIG. 4B schematically shows an antenna block as shown in FIG. 4A according to certain embodiments of the present disclosure.

FIG. 4A schematically shows a plurality of antenna blocks of the receiver antenna structure according to certain embodiments of the present disclosure, and FIG. 4B schematically shows an antenna block as shown in FIG. 4A according to certain embodiments of the present disclosure. It should be noted that, for illustration purposes, the structures as shown in FIGS. 4A and 4B are shown in lines with different line widths. However, the line widths as shown in FIGS. 4A and 4B do not reflect the actual line widths or sizes of the structures as shown in FIGS. 4A and 4B, and the actual sizes, shapes and corresponding positions of the structures as shown in FIGS. 4A and 4B may vary.

As shown in FIG. 4A, the receiver antenna structure 400 includes a plurality of antenna blocks 410 arranged in a matrix, and each antenna block 410 corresponds to a corresponding gate driver X-GOA 420 connected to a set of m X scan lines X1 to Xm extending in the column direction (i.e. the X direction) and a corresponding gate driver Y-GOA 430 connected to a set of n Y scan lines Y1 to Yn extending in the row direction (in the Y direction), where m and n are positive integers. In other words, each antenna block 410 corresponds to m*n pixels. As shown in FIG. 4B, each antenna block 410 includes an antenna 412, two diodes 414A and 414B, two transistors 416A and 416B, and a bridge structure 418. The antenna 412 includes an inner feeding end 412A and an outer feeding end 412B. As shown in FIGS. 4A and 4B, the inner feeding end 412A functions as a feeding end of the antenna 412, and the outer feeding end 412B functions as a reference end of the antenna 412, which is electrically connected to a common electrode $V_{COM}$ to receive the direct voltage level from the common electrode $V_{COM}$. The two diodes 414A and 414B are electrically connected to the feeding end 412A of the antenna 412 in parallel, and the two diodes 414A and 414B are disposed in opposite directions. The two switches 416A and 416B are respectively provided to connect the two diodes 414A and 414B to the bridge structure 418. The bridge structure 418 is a comb-shape structure, having a main line 418M electrically connected to the two switches 416A and 416B respectively, and a plurality of branch lines 418B extending from the main line 418M along the row direction to be electrically connected to the pixels. For description purposes, the diode 414A and the switch 416A on the upper side of FIG. 4B are referred to as the first diode 414A and the first switch 416A, and the diode 414B and the switch 416B on the lower side of FIG. 4B are referred to as the second diode 414B and the second switch 416B.

Figure 4C:
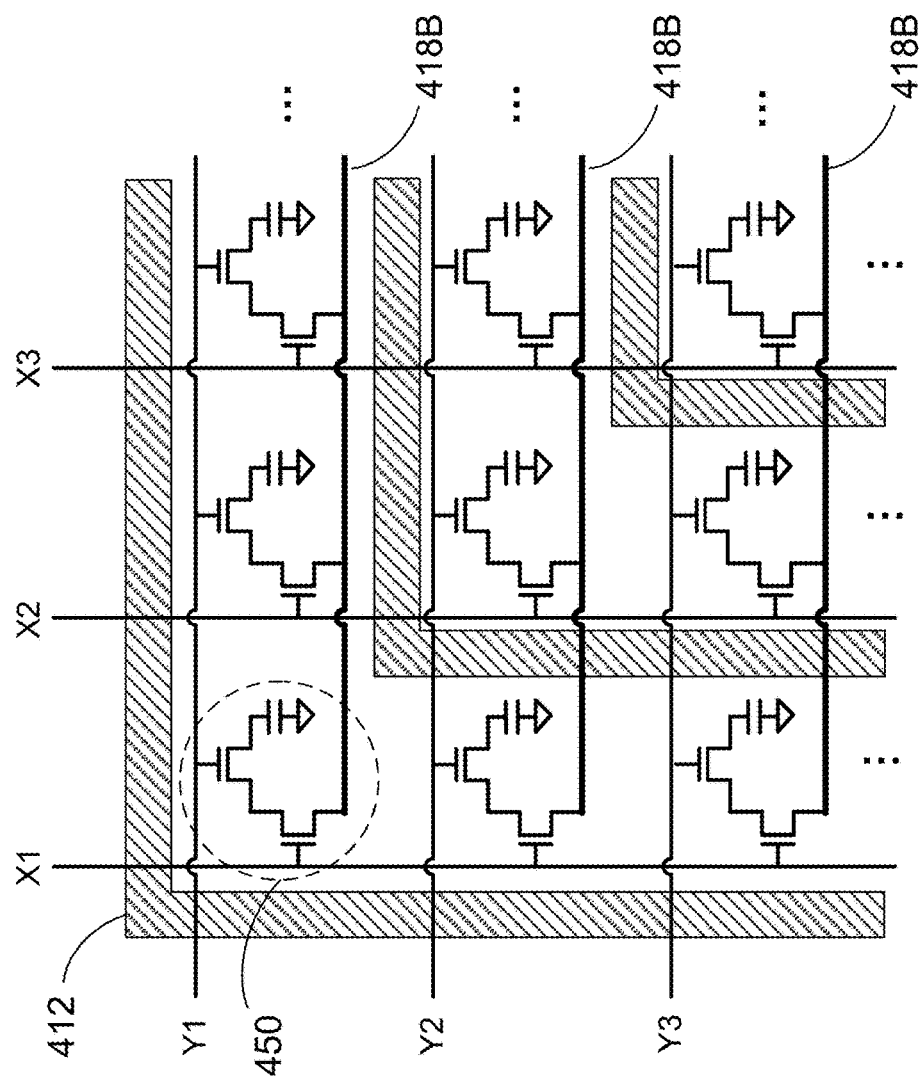
FIG. 4C schematically shows the connections between the pixels, the scan lines and the bridge structure in an antenna block according to certain embodiments of the present disclosure.

FIG. 4C schematically shows the connections between the pixels, the scan lines and the bridge structure in an antenna block according to certain embodiments of the present disclosure. Specifically, FIG. 4C shows a top-left portion of the antenna block 410, which includes three X scan lines X1, X2, X3 and three Y scan lines Y1, Y2, Y3 crossing over the antenna 412 and electrically connected to 3*3 pixels 450. Each of the pixels 450 is electrically connected to a corresponding branch lines 418B of the bridge structure 418, allowing the pixels 450 to be electrically connected to the antenna 412 via the bridge structure 418.

Figure 5A:
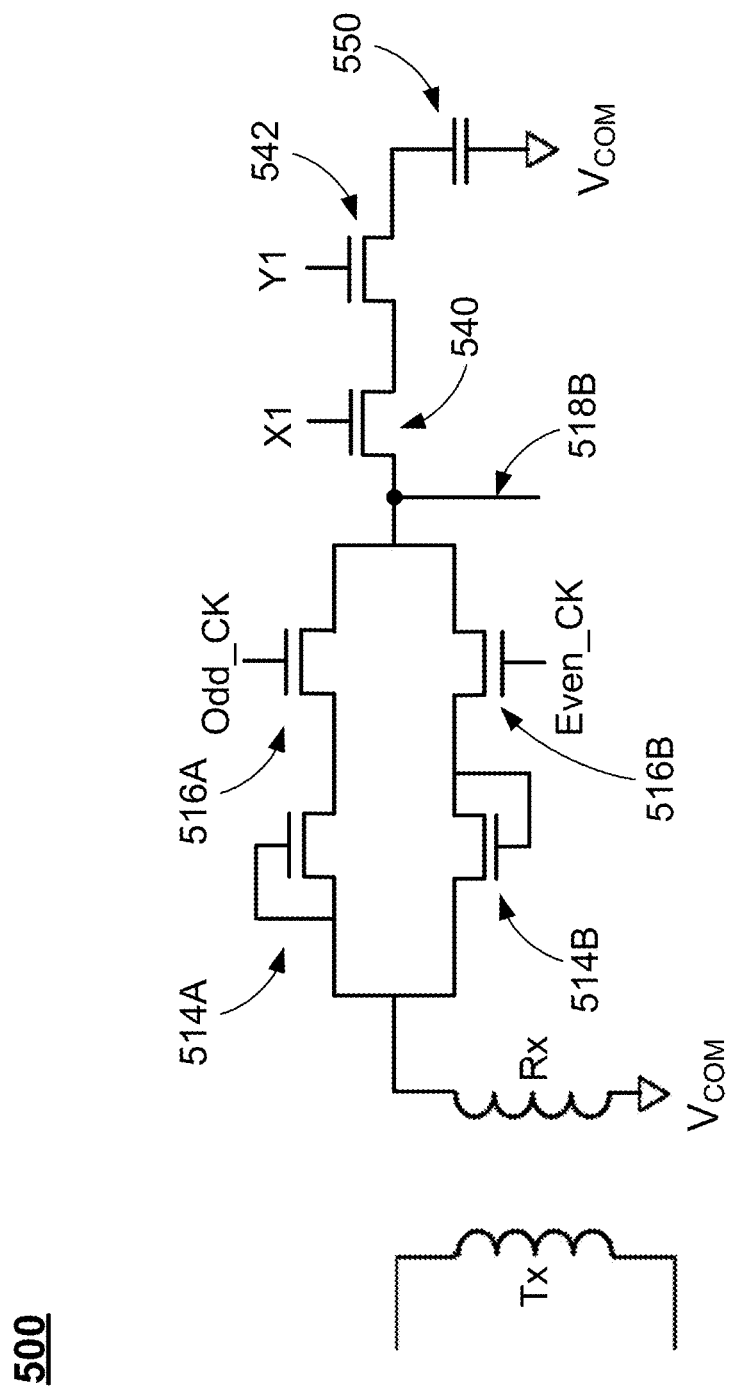
FIG. 5A schematically shows an antenna block connected to a pixel according to certain embodiments of the present disclosure.

FIG. 5A schematically shows an antenna block connected to a pixel according to certain embodiments of the present disclosure. As shown in FIG. 5A, the antenna block includes a receiver antenna Rx, two diodes 514A and 514B, two transistors 516A and 516B, and a branch line 518B of a bridge structure. The receiver antenna Rx, the two diodes 514A and 514B and the two transistors 516A and 516B are identical to the corresponding structures as shown in FIGS. 4A and 4B, including the antenna 412, the two diodes 414A and 414B and the two transistors 416A and 416B, and are thus not elaborated herein. The pixel includes two scan transistors 540 and 542 respectively connected to the scan lines X1 and Y1, and a capacitor 550. Further, a transmitter antenna Tx is provided to correspond to the receiver antenna Rx.

Figure 5B:
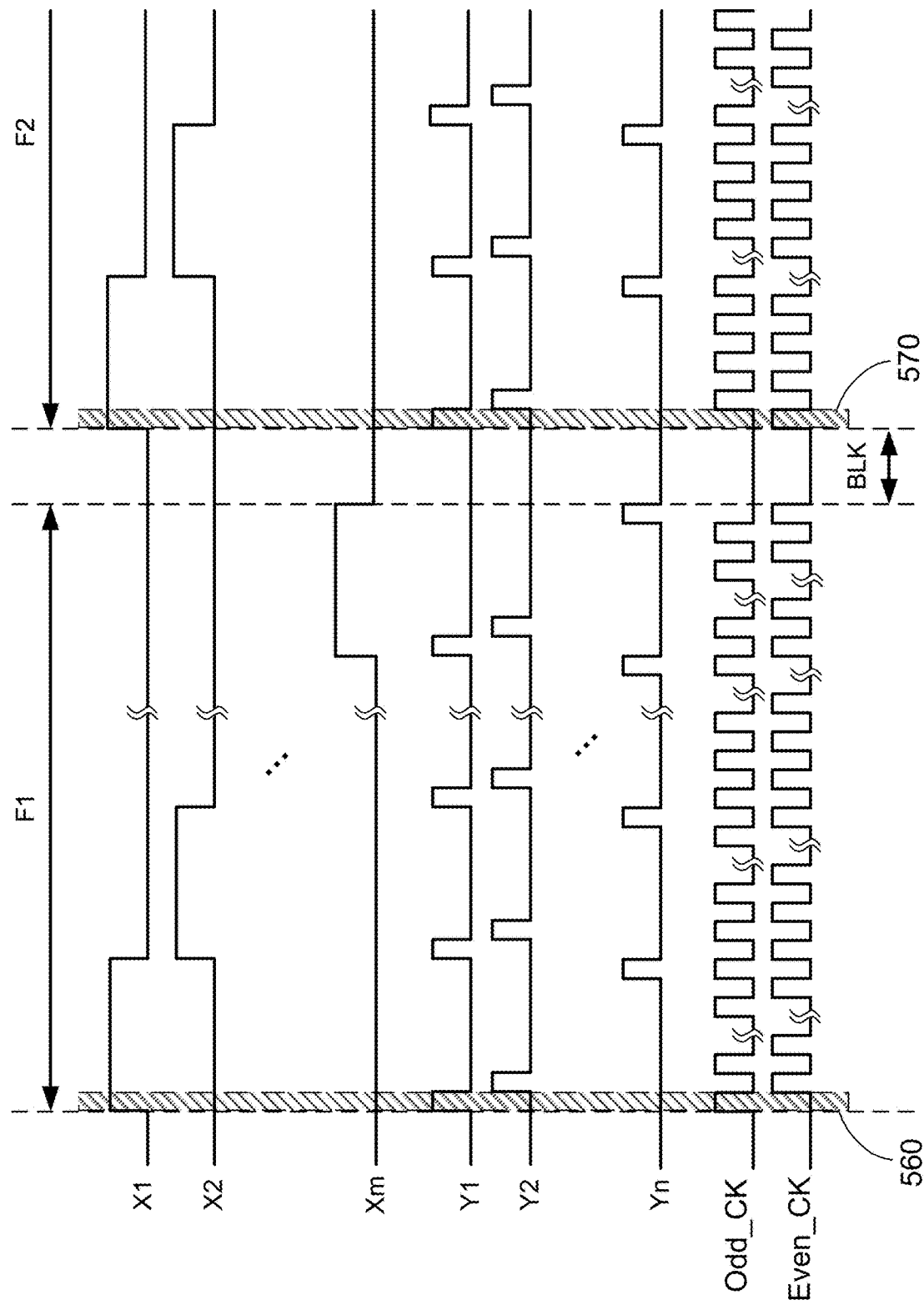
FIG. 5B schematically shows examples of the scan signals and clock signals for the antenna block and the pixel as shown in FIG. 5A according to certain embodiments of the present disclosure.

FIG. 5B schematically shows examples of the scan signals and clock signals for the antenna block and the pixel as shown in FIG. 5A according to certain embodiments of the present disclosure. As shown in FIG. 5B, each of the scan signals provided by the scan lines X1 to Xm and Y1 to Yn and the clock signals Odd_CK and Even_CK are shown as a pulse wave signal with a corresponding fixed period and a fixed pulse beam width, and the pulse wave signal has a conduction period and a turn-off period. Specifically, the conduction period of each scan signal is indicated by a high level, and the turn-off period of each scan signal is indicated by a low level, but the disclosure is not limited thereto. As shown in FIG. 5B, the odd clock pulse signal Odd_CK and the even clock pulse signal Even_CK are phase-inversed to each other between consecutive frames. Specifically, in a first frame F1, at the period 560, the scan signals being transmitted by the scan lines X1 and Y1 are both in the corresponding conduction period, thus turning the corresponding scan transistors 540 and 542 of the pixel as shown in FIG. 5A on. In this period 560, the odd clock pulse signal Odd_CK is in the conduction period, and the even clock pulse signal Even_CK is in the turn-off period. In a second frame F2, at the period 570, the scan signals being transmitted by the scan lines X1 and Y1 are both in the corresponding conduction period, thus turning the corresponding scan transistors 540 and 542 of the pixel as shown in FIG. 5A on. In this period 570, the odd clock pulse signal Odd_CK is in the turn-off period, and the even clock pulse signal Even_CK is in the conduction period. In other words, for a pixel 550 in consecutive frames, the odd clock pulse signal Odd_CK and the even clock pulse signal Even_CK, which are phase-inversed to each other, will allow the parallel paths formed by the diodes 514A and 514B and the switches 516A and 516B to turn on alternately.

Figure 5C:
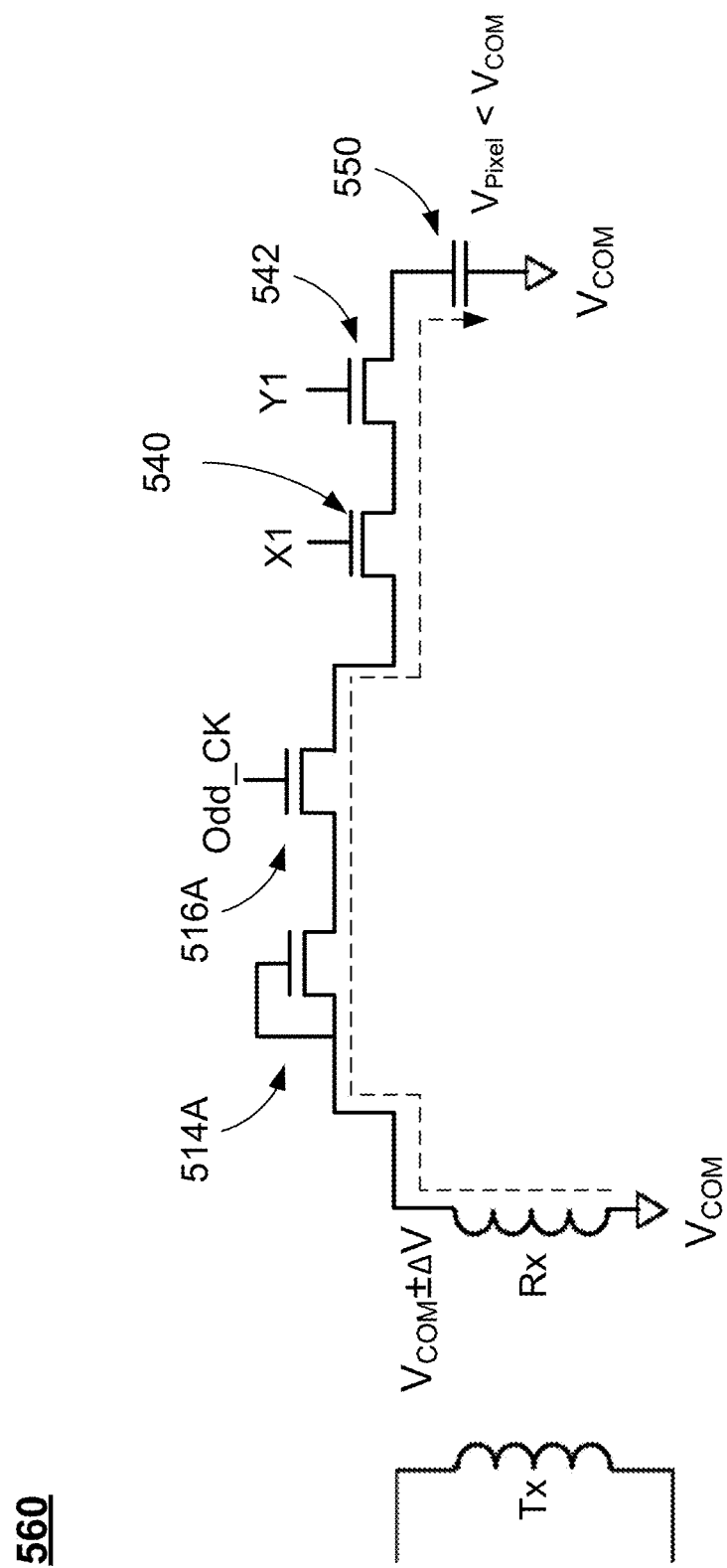

FIG. 5C schematically shows voltage transmission for the pixel as shown in FIG. 5A in a first frame as shown in FIG. 5B according to certain embodiments of the present disclosure, where the odd clock pulse signal is on. As shown in FIG. 5C, in the period 560 in the first frame F1, the odd clock pulse signal Odd_CK is in the conductive period, and the even clock pulse signal Even_CK is in the turn-off period, such that the first switch 516A is turned on, and the second switch 516B is turned off (and thus is not shown in FIG. 5C). In this case, the common voltage $V_{COM}$ will be greater than the pixel voltage Vpixel. Thus, when the receiver antenna Rx is induced by the transmitter antenna Tx to generate a voltage difference ΔV, the voltage level at the feeding end of the receiver antenna Rx will become $V_{COM}$+ ΔV, allowing the receiver antenna Rx to charge the capacitor 550 of the pixel through the first parallel path formed by the first diode 514A and the first switch 516A.

Figure 5D:
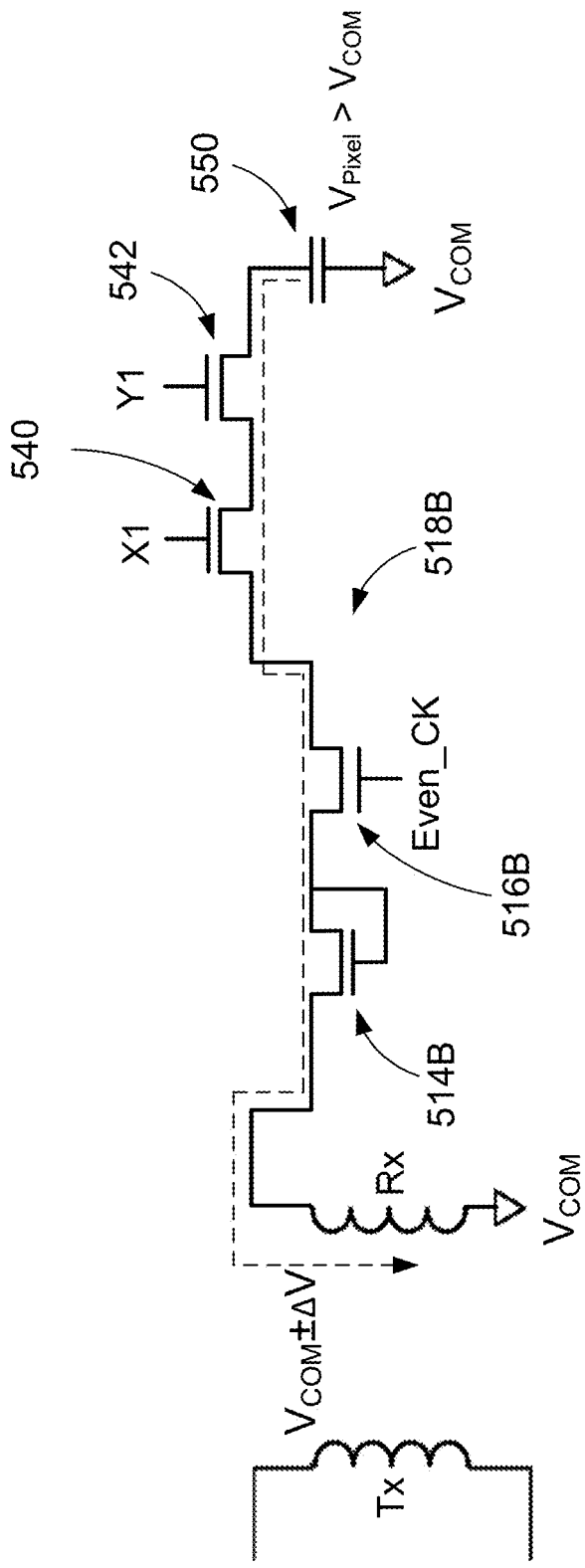

FIG. 5D schematically shows voltage transmission for the pixel as shown in FIG. 5A in a second frame as shown in FIG. 5B according to certain embodiments of the present disclosure, where the even clock pulse signal is on. As shown in FIG. 5D, in the period 570 in the second frame F2, the even clock pulse signal Even_CK is in the conductive period, and the odd clock pulse signal Odd_CK is in the turn-off period, such that the second switch 516B is turned on, and the first switch 516A is turned off (and thus is not shown in FIG. 5D). In this case, the pixel voltage Vpixel will be greater than the common voltage $V_{COM}$. Thus, the capacitor 550 of the pixel will discharge the voltage stored to the receiver antenna Rx through the second parallel path formed by the second diode 514B and the second switch 516B.

It should be noted that, as shown in FIG. 5B, a blanking period BLK exists between the two consecutive frames F1 and F2, where all signals are in the turn-off periods, allowing the clock pulse signals Odd_CK and Even_CK to reset in the second frame F2 and switch to a different phase from the previous frame F1. The length of the blanking period BLK may be vary. In certain embodiments, it is possible that the signals can be configured such that no blanking period BLK is required between the consecutive frames.

Figure 6:
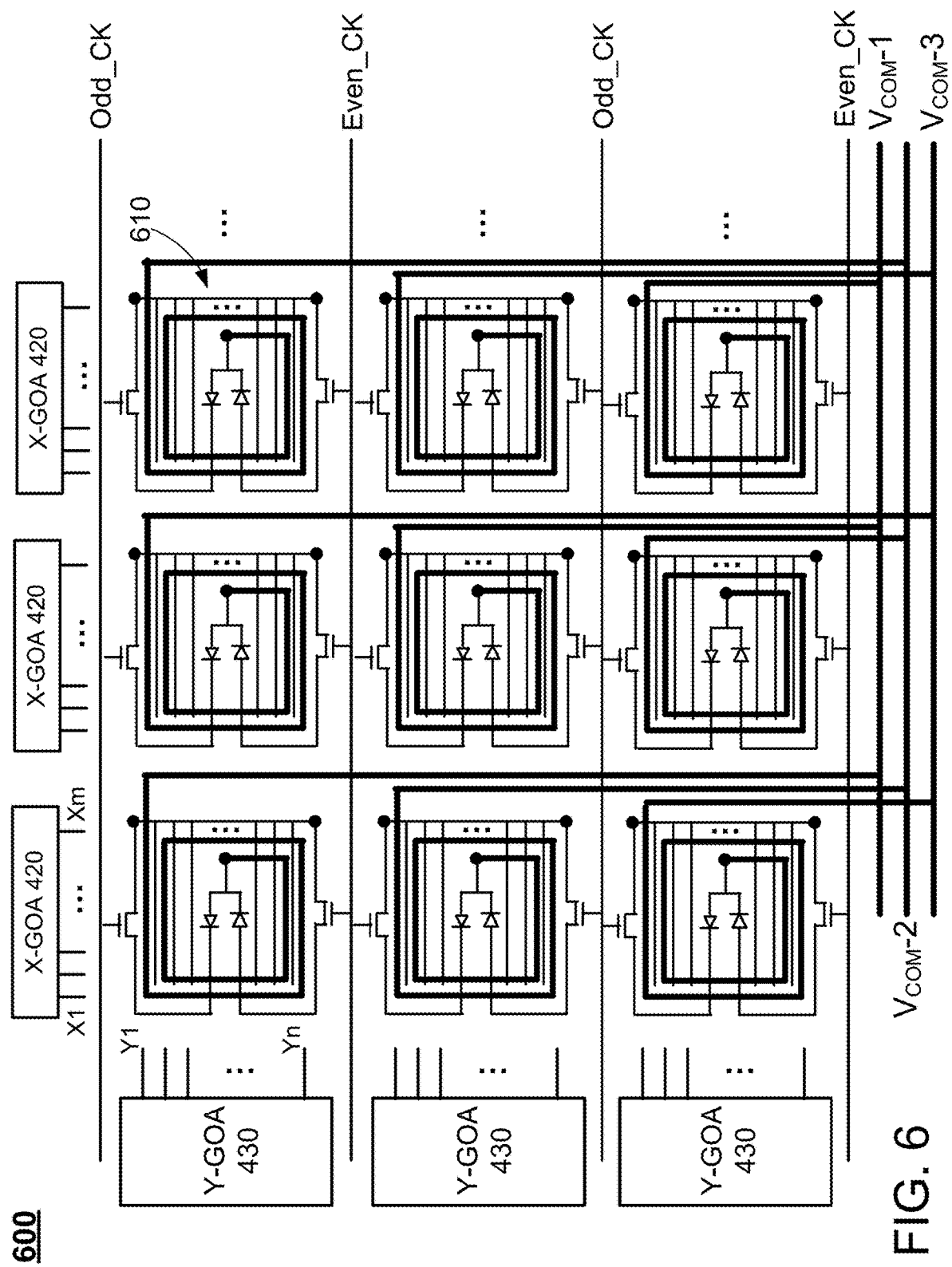
FIG. 6 schematically shows a plurality of antenna blocks of the receiver antenna structure according to certain embodiments of the present disclosure.

In the embodiments as described above, only one single common electrode $V_{COM}$ is provided. In certain embodiments, the display panel may include multiple common electrodes disposed in different layers without being connected to one another. In this case, different direct voltage levels may be provided separately to each of the common electrodes. For example, FIG. 6 schematically shows a plurality of antenna blocks of the receiver antenna structure according to certain embodiments of the present disclosure. As shown in FIG. 6, the only difference between the structures of the receiver antenna structure 600 and the receiver antenna structure 400 as shown in FIG. 4A exists in that three different common electrodes $V_{COM}$-1, $V_{COM}$-2 and $V_{COM}$-3 are provided, allowing the reference end of the antenna of each antenna block 610 to be electrically connected to one of the common electrodes $V_{COM}$-1, $V_{COM}$-2 and $V_{COM}$-3. Other structures, components and layers of the receiver antenna structure 600 are identical to the corresponding structures, components and layers with the same reference numbers in the receiver antenna structure 400 as shown in FIG. 4A, and are thus not elaborated herein. Specifically, as shown in FIG. 6, in the top row of the antenna blocks, the antenna in the leftmost antenna block is connected to the common electrode $V_{COM}$-1, the antenna in the middle antenna block is connected to the common electrode $V_{COM}$-3, and the antenna in the rightmost antenna block is connected to the common electrode $V_{COM}$-2. In the middle row of the antenna blocks, the antenna in the leftmost antenna block is connected to the common electrode $V_{COM}$-2, the antenna in the middle antenna block is connected to the common electrode $V_{COM}$-1, and the antenna in the rightmost antenna block is connected to the common electrode $V_{COM}$-3. In the bottom row of the antenna blocks, the antenna in the leftmost antenna block is connected to the common electrode $V_{COM}$-3, the antenna in the middle antenna block is connected to the common electrode $V_{COM}$-2, and the antenna in the rightmost antenna block is connected to the common electrode $V_{COM}$-1. In this case, any two adjacent antenna blocks 610, either in the row direction or the column direction, are electrically connected to two different ones of the common electrodes $V_{COM}$-1, $V_{COM}$-2 and $V_{COM}$-3 respectively.

Figure 7:
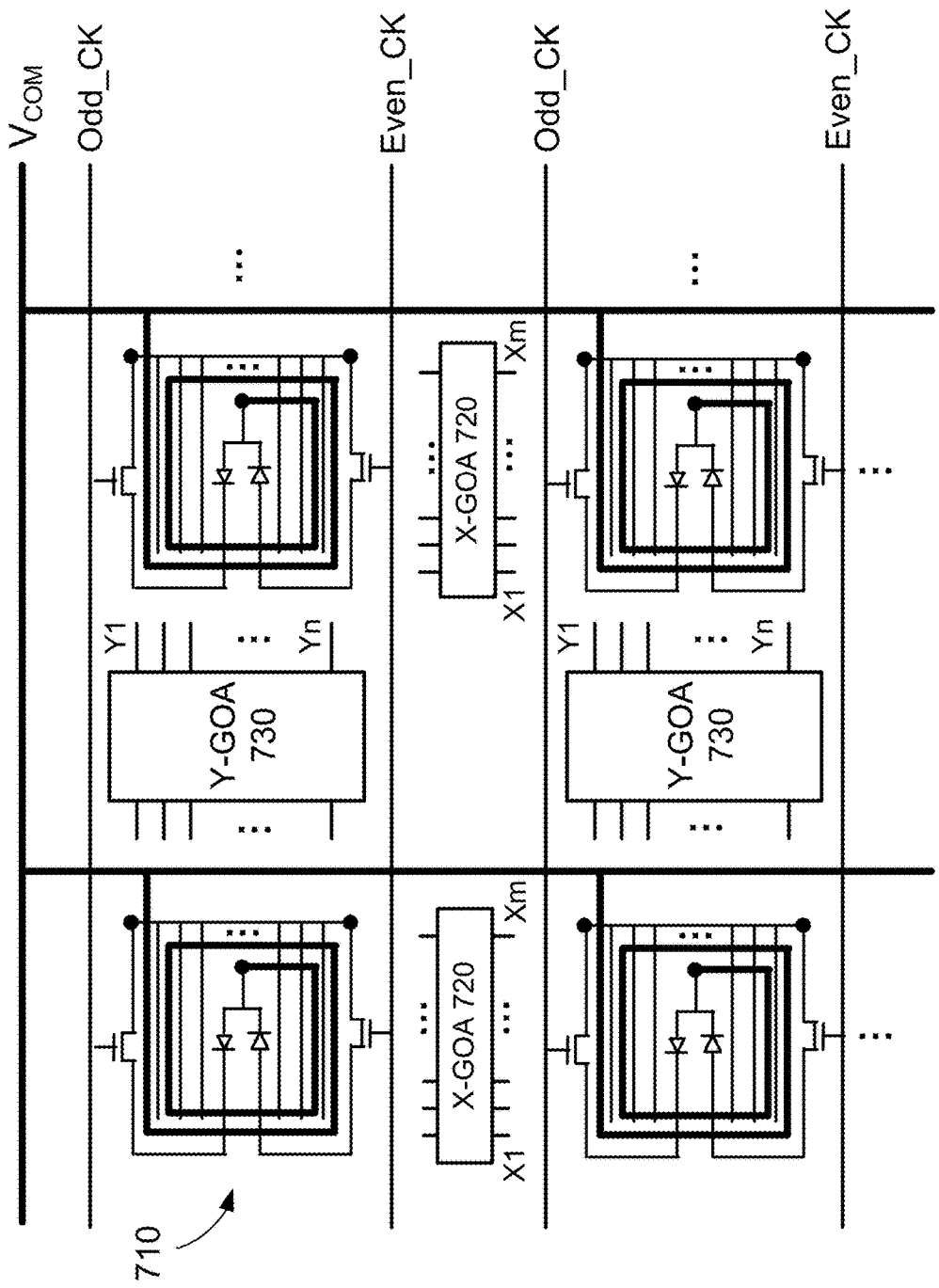
FIG. 7 schematically shows a plurality of antenna blocks of the receiver antenna structure according to certain embodiments of the present disclosure.

In the embodiments as described above, the gate drivers are disposed at a peripheral area of the display panel. In certain embodiments, the gate drivers may be moved into the display area and disposed between the antenna blocks, thus reducing or eliminating the peripheral area of the display panel. For example, FIG. 7 schematically shows a plurality of antenna blocks of the receiver antenna structure according to certain embodiments of the present disclosure. As shown in FIG. 7, the receiver antenna structure 700 includes a plurality of antenna blocks 710 arranged in a 2*2 matrix. Specifically, the gate drivers X-GOA 720 are disposed between the two adjacent rows of the antenna blocks 710, and the gate drivers Y-GOA 730 are disposed between the two adjacent rows of the antenna blocks 710. In other words, each gate driver is disposed in the display area between two adjacent antenna blocks 710. The structures and components of the antenna blocks 710 are similar to the corresponding structures and components of the antenna blocks 410 as shown in FIGS. 4A and 4B, and are thus not elaborated herein.

In the embodiments as described above, the X scan lines X1 to Xm and the Y scan lines Y1 to Yn may have crossover areas with the antennas Rx. Specifically, the crossover areas between the receiver antenna and the scan lines will be referred to as the "antenna crossover area." For example, FIG. 8A schematically shows the crossover areas between a receiver antenna and a plurality of scan lines according to certain embodiments of the present disclosure. As shown in FIG. 8A, the antenna block 800 has an antenna 810 corresponding to 60 X scan lines X1 to X60 and 27 Y scan lines Y1 to Y27, and the winding number of the antenna 810 is N=3. For the X scan lines, the leftmost X scan line X1 does not have any antenna crossover area with the antenna 810, and the rightmost X scan line X60 has only one antenna crossover area 840 with the antenna 810. The middle X scan line X30, however, has a total of six antenna crossover areas 820 with the antenna 810, which is twice the winding number of the antenna 810. For the Y scan lines, the uppermost and lowermost Y scan lines Y1 and Y27 do not have any antenna crossover area with the antenna 810. The middle Y scan line Y13, however, also has a total of six antenna crossover areas 830 with the antenna 810. It should be noted that the scan lines located at the center regions corresponding to the antenna 810 may have more antenna crossover areas with the antenna 810, and the scan lines located near the peripheral regions corresponding to the antenna 810 may have fewer antenna crossover areas with the antenna 810.

Figure 8C:
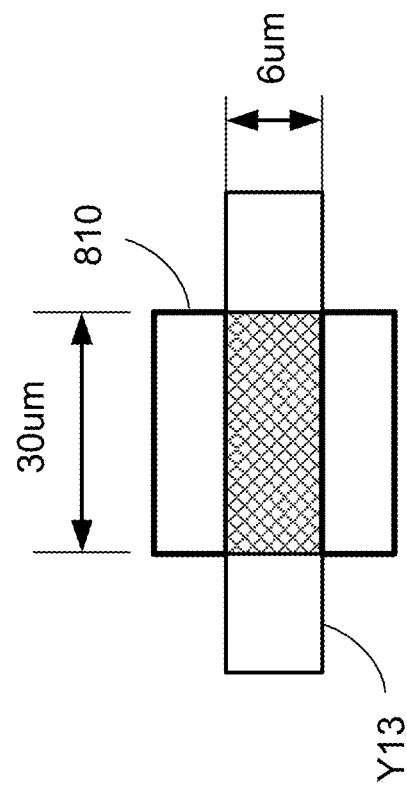
FIG. 8C schematically shows a crossover area between a Y scan line and a vertical segment of the receiver antenna as shown in FIG. 8A according to certain embodiments of the present disclosure.
Figure 8B:
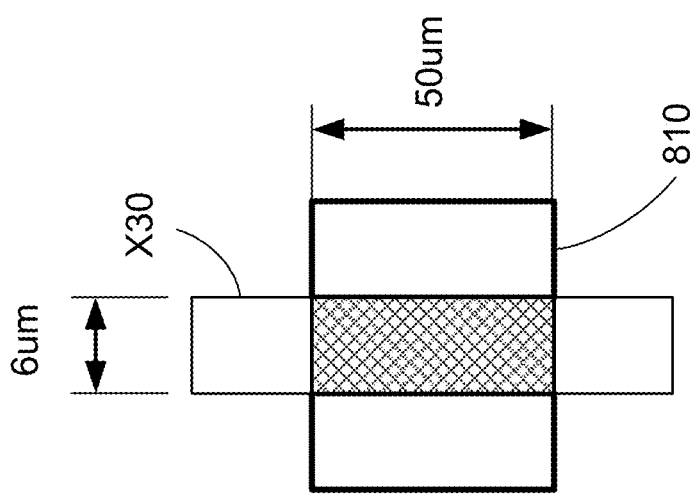
FIG. 8B schematically shows a crossover area between an X scan line and a horizontal segment of the receiver antenna as shown in FIG. 8A according to certain embodiments of the present disclosure.

FIG. 8B schematically shows a crossover area between an X scan line and a horizontal segment of the receiver antenna as shown in FIG. 8A according to certain embodiments of the present disclosure, and FIG. 8C schematically shows a crossover area between a Y scan line and a vertical segment of the receiver antenna as shown in FIG. 8A according to certain embodiments of the present disclosure. As shown in FIG. 8B, a width of the X scan line X30 is 6 µm, and a width of the horizontal segment of the antenna 810 is 50 µm. Thus, the antenna crossover area 820 is 300 µm². As shown in FIG. 8C, a width of the Y scan line Y13 is 6 µm, and a width of the vertical segment of the antenna 810 is 50 µm. Thus, the antenna crossover area 830 is 180 µm².

Figure 8E:
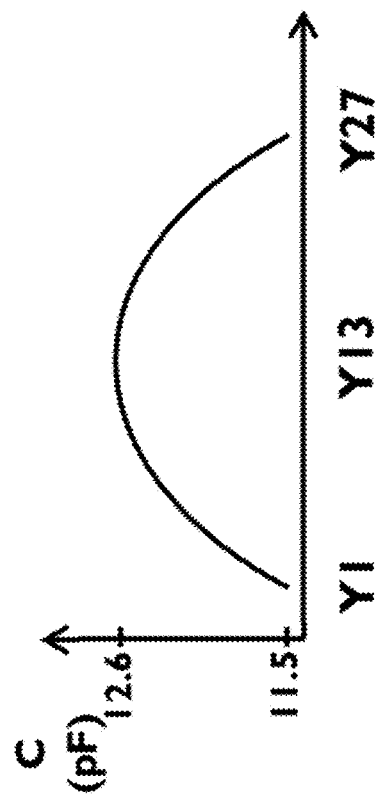
FIG. 8E shows a chart of the capacitance of the Y scan lines as shown in FIG. 8A according to certain embodiments of the present disclosure.
Figure 8D:
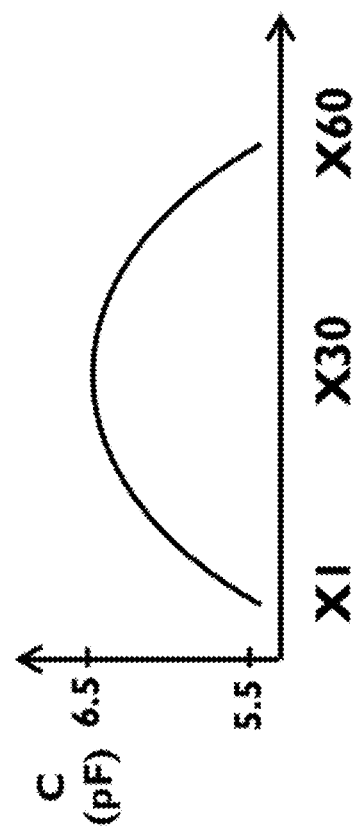
FIG. 8D shows a chart of the capacitance of the X scan lines as shown in FIG. 8A according to certain embodiments of the present disclosure.

For the scan lines as shown in FIG. 8A, the loading of each scan line related to the crossover area corresponding to the scan line. For example, FIG. 8D shows a chart of the capacitance of the X scan lines as shown in FIG. 8A according to certain embodiments of the present disclosure, and FIG. 8E shows a chart of the capacitance of the Y scan lines as shown in FIG. 8A according to certain embodiments of the present disclosure. As shown in FIG. 8D, the capacitance of the leftmost X scan line X1 (which does not have any crossover area with the antenna 810) is about 5.5 pF, while the capacitance of the middle X scan line X30 (which has a total of six crossover areas 820 with the antenna 810) is about 6.5 pF. As shown in FIG. 8E, the capacitance of the uppermost Y scan line Y1 (which does not have any crossover area with the antenna 810) is about 11.5 pF, while the capacitance of the middle Y scan line Y13 (which has a total of six crossover areas 830 with the antenna 810) is about 12.6 pF.

Figure 9:
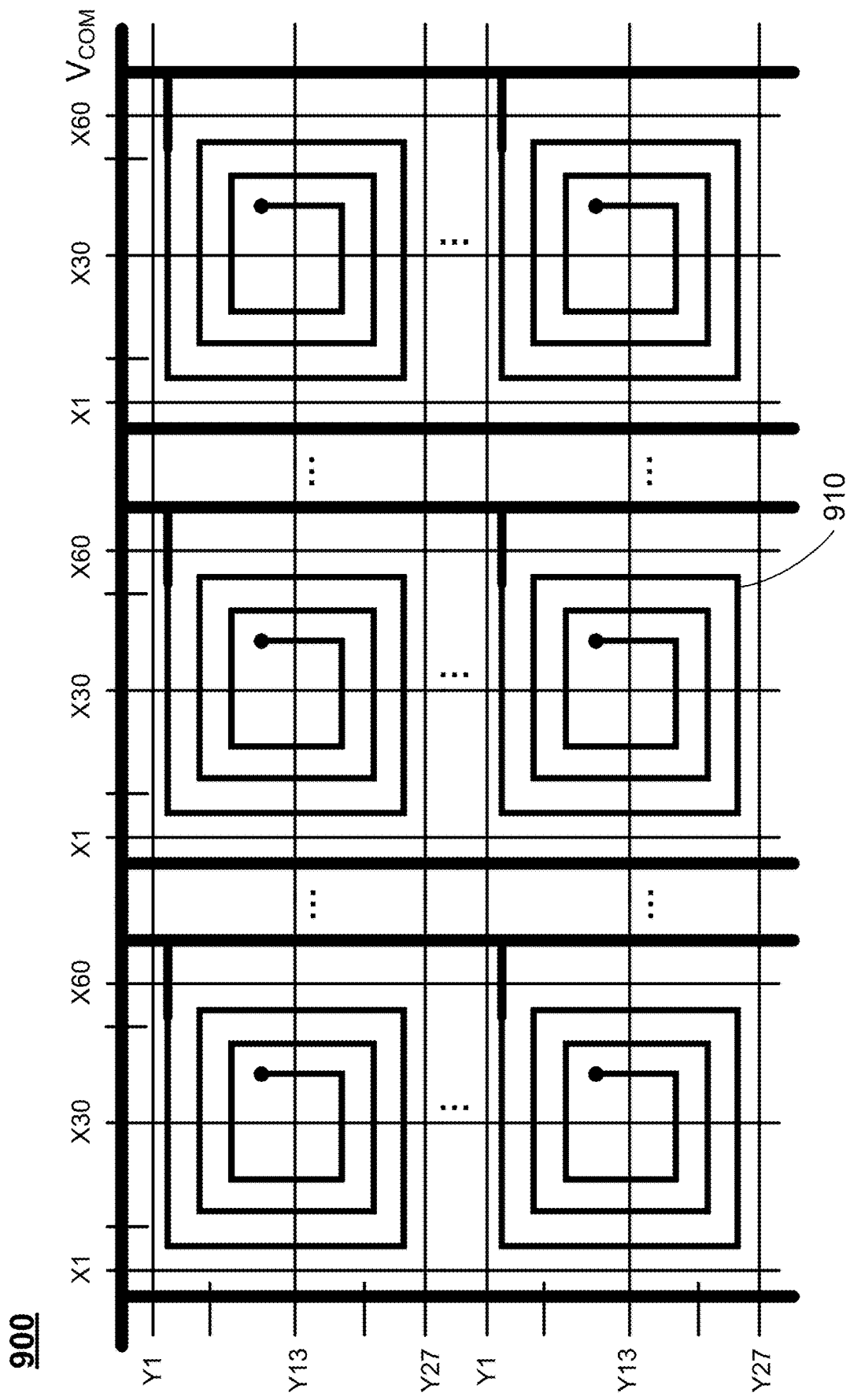
FIG. 9 schematically shows the crossover areas between receiver antennas and a plurality of scan lines in a display panel according to certain embodiments of the present disclosure.

It should be noted that FIG. 8A only shows the antenna crossover areas between the scan lines with one single receiver antenna 810. FIG. 9 schematically shows the crossover areas between receiver antennas and a plurality of scan lines in a display panel according to certain embodiments of the present disclosure. As shown in FIG. 9, the display panel 900 may include multiple receiver antenna arranged in an array. Thus, the quantities of the antenna crossover areas for each scan line will be further increased, and the differences of the loadings between the scan lines will be further amplified, resulting in an uneven loading structure. To remedy this deficiency, another aspect of the present disclosure provides a display panel with specific scan line and common electrode design to compensate the loadings between the scan lines.

Figure 10A:
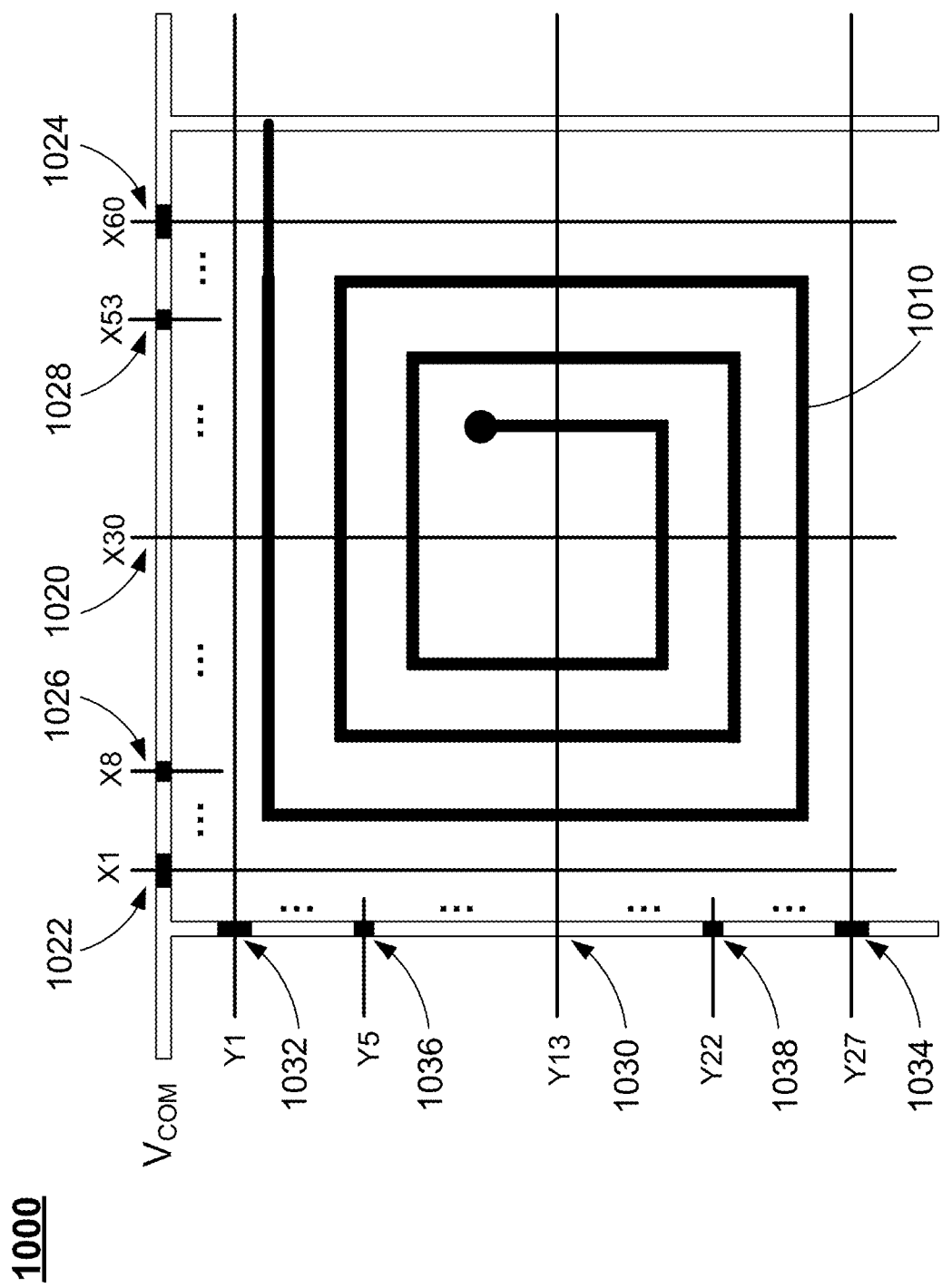
FIG. 10A schematically shows the crossover areas between a receiver antenna and a plurality of scan lines according to certain embodiments of the present disclosure.

FIG. 10A schematically shows the crossover areas between a receiver antenna and a plurality of scan lines according to certain embodiments of the present disclosure. As shown in FIG. 10A, the common electrode $V_{COM}$ has a plurality of strip portions disposed around the receiver antenna 1010. For the X scan lines X1 to X60, each of the X scan lines has a crossover portion overlapping with the horizontal strip portion of the common electrode $V_{COM}$. For example, the middle X scan line X30 has a corresponding crossover portion 1020, the leftmost X scan line X1 has a corresponding crossover portion 1022, and the rightmost X scan line X60 has a corresponding crossover portion 1024. The other two X scan lines X8 and X53 as shown in FIG. 10A also have corresponding crossover portions 1026 and 1028. Similarly, for the Y scan lines Y1 to Y27, each of the Y scan lines has a crossover portion overlapping with the vertical strip portion of the common electrode $V_{COM}$. For example, the middle Y scan line Y13 has a corresponding crossover portion 1030, the uppermost Y scan line Y1 has a corresponding crossover portion 1032, and the bottommost Y scan line Y27 has a corresponding crossover portion 1034. The other two Y scan lines Y5 and Y22 as shown in FIG. 10A also have corresponding crossover portions 1036 and 1038. Thus, the widths of the crossover portions of the X and Y scan lines may be adjusted for compensation purposes.

Figure 10B:
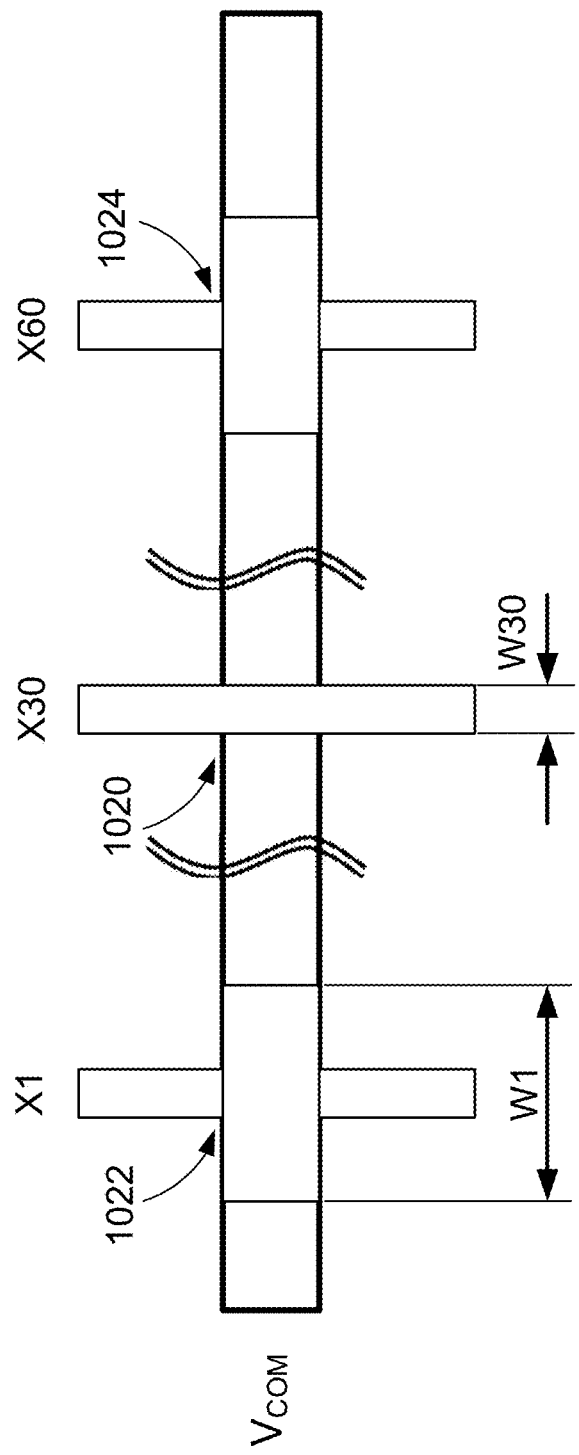
FIG. 10B schematically shows areas of the crossover portions between X scan lines and a horizontal strip portion of the common electrode as shown in FIG. 8A according to certain embodiments of the present disclosure.

FIG. 10B schematically shows areas of the crossover portions between X scan lines and a horizontal strip portion of the common electrode as shown in FIG. 8A according to certain embodiments of the present disclosure. As shown in FIG. 10B, the width W30 of the crossover portion 1020 of the middle X scan line X30 is equal to the width of the remaining portion of the X scan line X30. In other words, the middle X scan line X30, as the center scan line among the X scan lines X1 to X60, has a constant width throughout the scan line and the crossover portion 1020. On the other hand, the width W1 of the crossover portion 1022 of the leftmost X scan line X1 is greater than the width of the remaining portion of the X scan line X1 (which is also W30, as all scan lines have equal widths expect for the crossover portions). Similarly, the width of the crossover portion 1024 of the rightmost X scan line X60 is also greater than the width of the remaining portion of the X scan line X60 (which is also W30). Referring back to FIG. 10A, the widths of the crossover portions 1026 and 1028 of the other two X scan lines X8 and X53 are also greater than the width of the remaining portion of the X scan lines. Further, the width W1 of the crossover portion 1022 of the leftmost X scan line X1 is greater than the width of the crossover portion 1026 of the X scan line X8, and the width of the crossover portion 1026 of the X scan line X8 is greater than the width W30 of the crossover portion 1020 of the middle X scan line X30. Similarly, the width of the crossover portion 1024 of the rightmost X scan line X60 is greater than the width of the crossover portion 1028 of the X scan line X53, and the width of the crossover portion 1028 of the X scan line X53 is greater than the width W30 of the crossover portion 1020 of the middle X scan line X30. The crossover portions 1030-1038 of the Y scan lines have similar width arrangements, and details thereof are not elaborated herein.

In certain embodiments, the width of the crossover portion of each of the scan lines is determined by a total crossover area of the antenna crossover areas corresponding to each of the scan lines. For example, for the middle X scan line X30, which has the maximum quantity and the most crossover area of the antenna crossover areas, the width of the crossover portion 1020 is not adjusted. In comparison, for the leftmost and the rightmost X scan lines X1 and X60, which has the fewest quantity and the least crossover area of the antenna crossover areas, the width of the crossover portions 1022 and 1024 are significantly increased to increase the overall loadings for these X scan lines X1 and X60. In this way, the loading distributions between the X scan lines can be even.

Figure 10D:
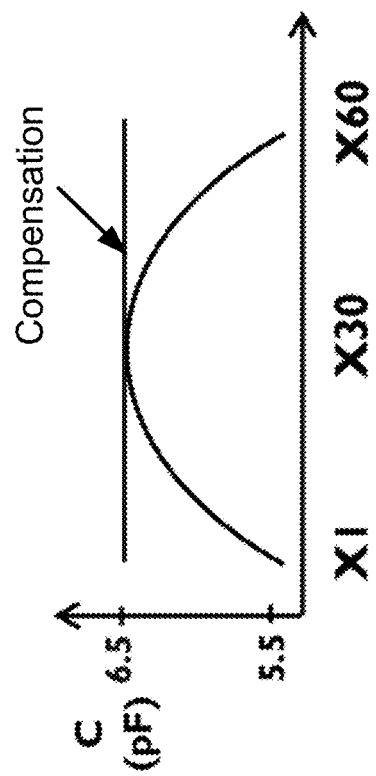
FIG. 10D shows a chart of the capacitance of the X scan lines as shown in FIG. 10A according to certain embodiments of the present disclosure.
Figure 10C:
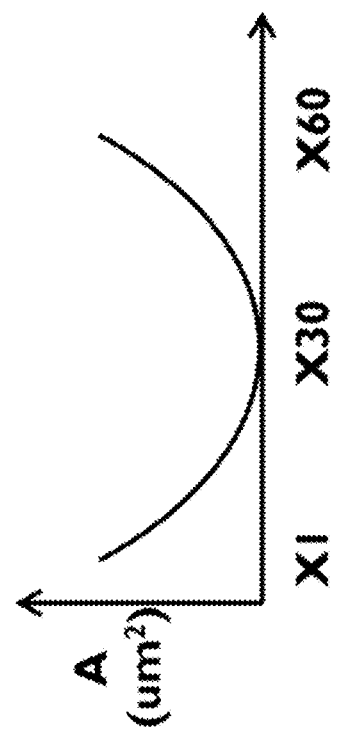
FIG. 10C shows a chart of the compensation area of the X scan lines as shown in FIG. 8A according to certain embodiments of the present disclosure.

FIG. 10C shows a chart of the compensation area of the X scan lines as shown in FIG. 8A according to certain embodiments of the present disclosure, and FIG. 10D shows a chart of the capacitance of the X scan lines as shown in FIG. 10A according to certain embodiments of the present disclosure. As shown in FIG. 10C, the compensation area (i.e., the area of the crossover portion) of the middle X scan line X30 is zero because the width of the crossover portion 1020 of the middle X scan line X30 is not increased. In comparison, the compensation area (i.e., the area of the crossover portion) of each of the X scan lines X1 and X60 are the greatest because the width of each of the crossover portions 1022 and 1024 of the X scan lines X1 and X60 is significantly increased. Thus, the capacitance of all of the X scan lines may be compensated to be about 6.5 pF, as shown in FIG. 10D, thus allowing the X scan lines to have even loadings.

Figure 10F:
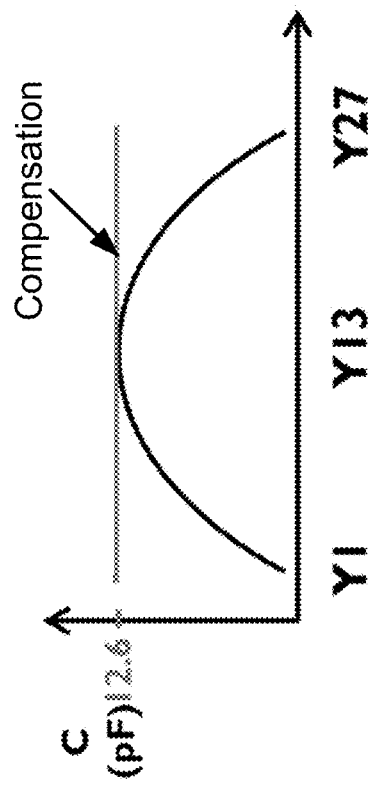
FIG. 10F shows a chart of the capacitance of the Y scan lines as shown in FIG. 10A according to certain embodiments of the present disclosure.
Figure 10E:
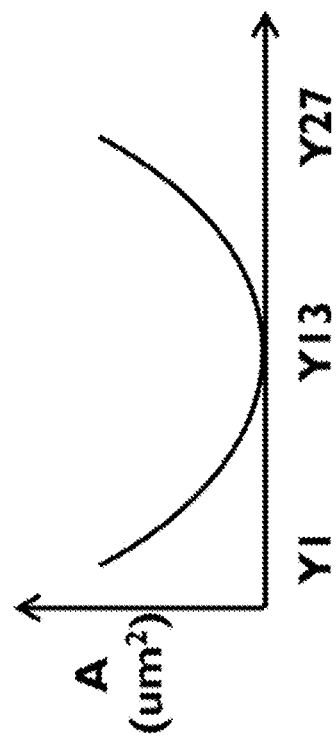
FIG. 10E shows a chart of the compensation area of the Y scan lines as shown in FIG. 10A according to certain embodiments of the present disclosure.

FIG. 10E shows a chart of the compensation area of the Y scan lines as shown in FIG. 10A according to certain embodiments of the present disclosure, and FIG. 10F shows a chart of the capacitance of the Y scan lines as shown in FIG. 10A according to certain embodiments of the present disclosure. As shown in FIG. 10E, the compensation area (i.e., the area of the crossover portion) of the middle Y scan line Y13 is zero because the width of the crossover portion 1030 of the middle Y scan line Y13 is not increased. In comparison, the compensation area (i.e., the area of the crossover portion) of each of the Y scan lines Y1 and Y27 are the greatest because the width of each of the crossover portions 1032 and 1034 of the Y scan lines Y1 and Y27 is significantly increased. Thus, the capacitance of all of the Y scan lines may be compensated to be about 12.6 pF, as shown in FIG. 10F, thus allowing the Y scan lines to have even loadings.

Figure 11:
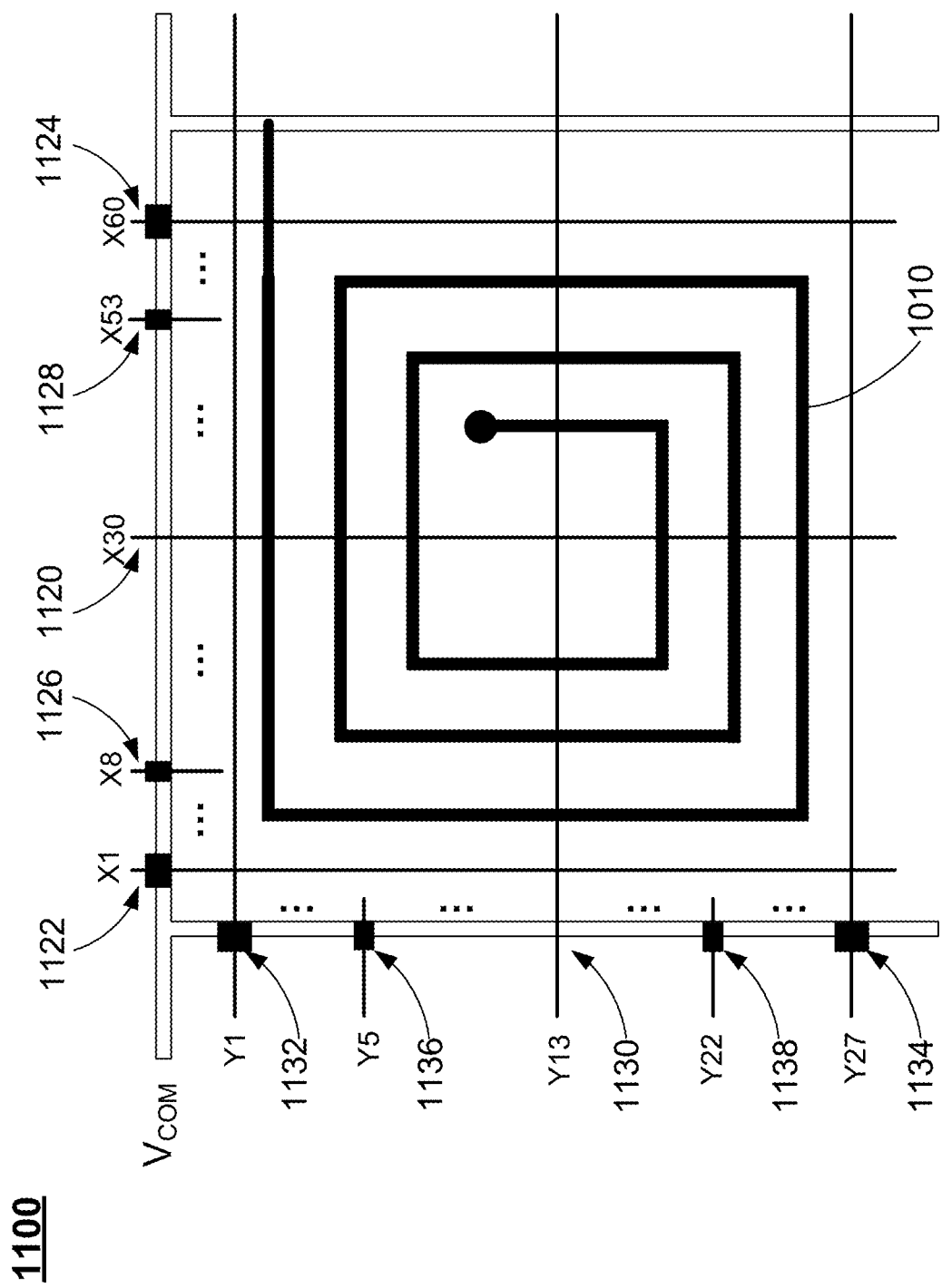
FIG. 11 schematically shows the crossover areas between a receiver antenna and a plurality of scan lines according to certain embodiments of the present disclosure.

As shown in FIG. 10A, the width of the scan lines may be adjusted at the crossover portion to compensate the loading. In certain embodiments, the width of the common electrode $V_{COM}$ may also be adjusted. For example, FIG. 11 schematically shows the crossover areas between a receiver antenna and a plurality of scan lines according to certain embodiments of the present disclosure. Specifically, the only difference between the structure 1100 and the corresponding structure 1000 as shown in FIG. 10A exists in that, instead of merely adjusting the widths of the crossover portions of the X and Y scan lines, the line widths of the strip portions of the common electrode $V_{COM}$ may also be adjusted. In particular, for the horizontal strip portion of the common electrode $V_{COM}$ which corresponds to the X scan lines, a plurality of overlapping portions 1122, 1124, 1126 and 1128 are correspondingly provided to correspond to the crossover portions of the X scan lines X1, X60, X8 and X53 respectively, and the widths of the overlapping portions 1122, 1124, 1126 and 1128 are greater than the width of the remaining portion of the horizontal strip portion of the common electrode $V_{COM}$. Similarly, for the vertical strip portion of the common electrode $V_{COM}$ which corresponds to the Y scan lines, a plurality of overlapping portions 1132, 1134, 1136 and 1138 are correspondingly provided to correspond to the crossover portions of the Y scan lines Y1, Y27, Y5 and Y22 respectively, and the widths of the overlapping portions 1132, 1134, 1136 and 1138 are greater than the width of the remaining portion of the vertical strip portion of the common electrode $V_{COM}$.

The inventors have performed experiments and simulations to the compensation structures as shown in FIG. 10A according to certain embodiments of the disclosure to determine the compensation parameters. For example, a receiver antenna structure having 12*5 receiver antennas arranged in a matrix having 5 rows and 12 columns is used to perform the simulation, where each receiver antenna has a winding number N=12, and the size of the horizontal and vertical segments of each receiver antenna are shown in FIGS. 8B and 8C. In this case, for the middle X scan line X30 as shown in FIG. 10A, the quantity of the antenna crossover areas is 120 (=12*2*5), and for the middle Y scan line Y13 as shown in FIG. 10A, the quantity of the antenna crossover areas is 288 (=12*2*12).

Figure 12A:
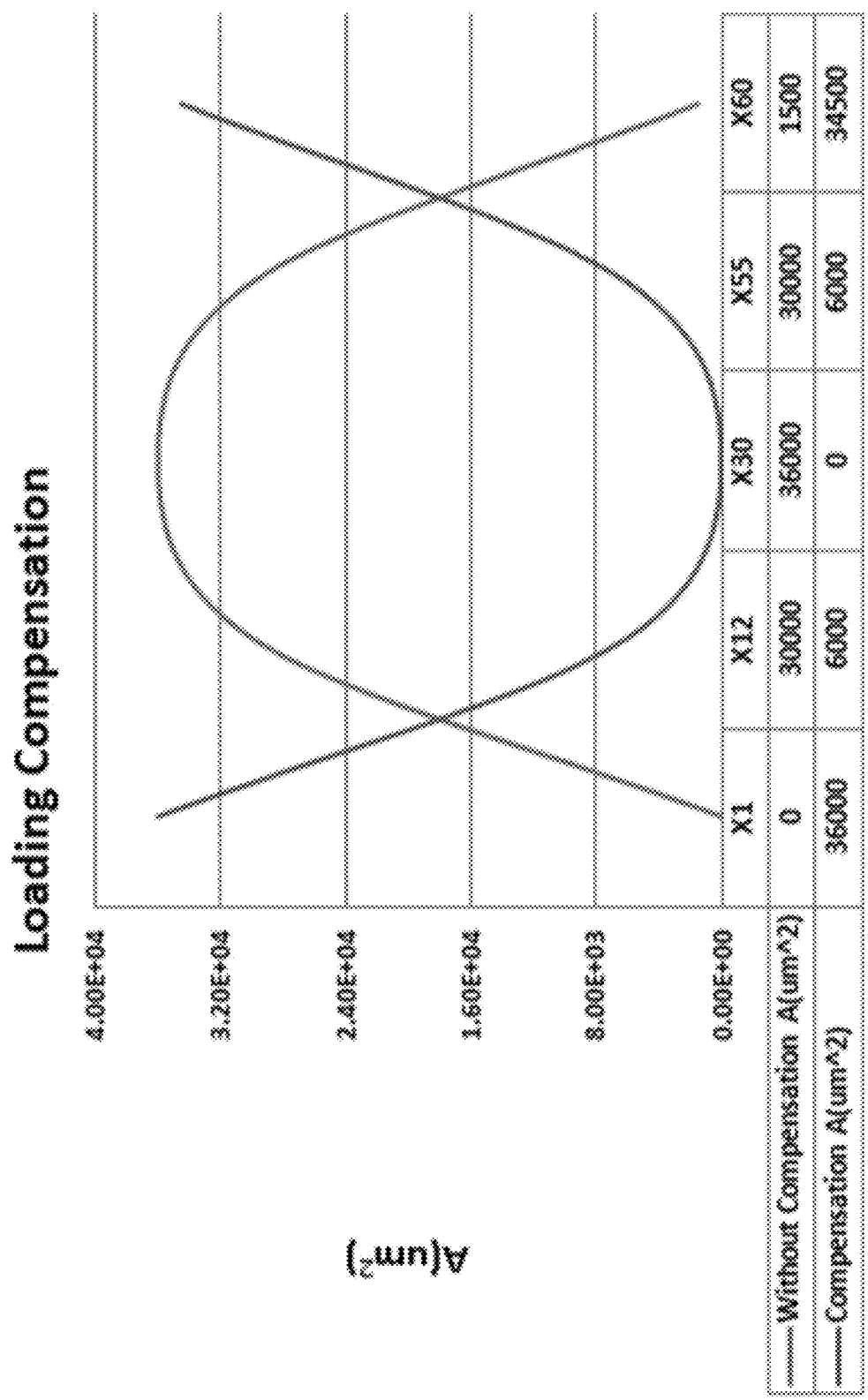
FIG. 12A shows a chart of the compensation area of the X scan lines corresponding to a column of five receiver antennas according to certain embodiments of the present disclosure, where the winding number of each of the receiver antenna is N=12.
Figure 12B:
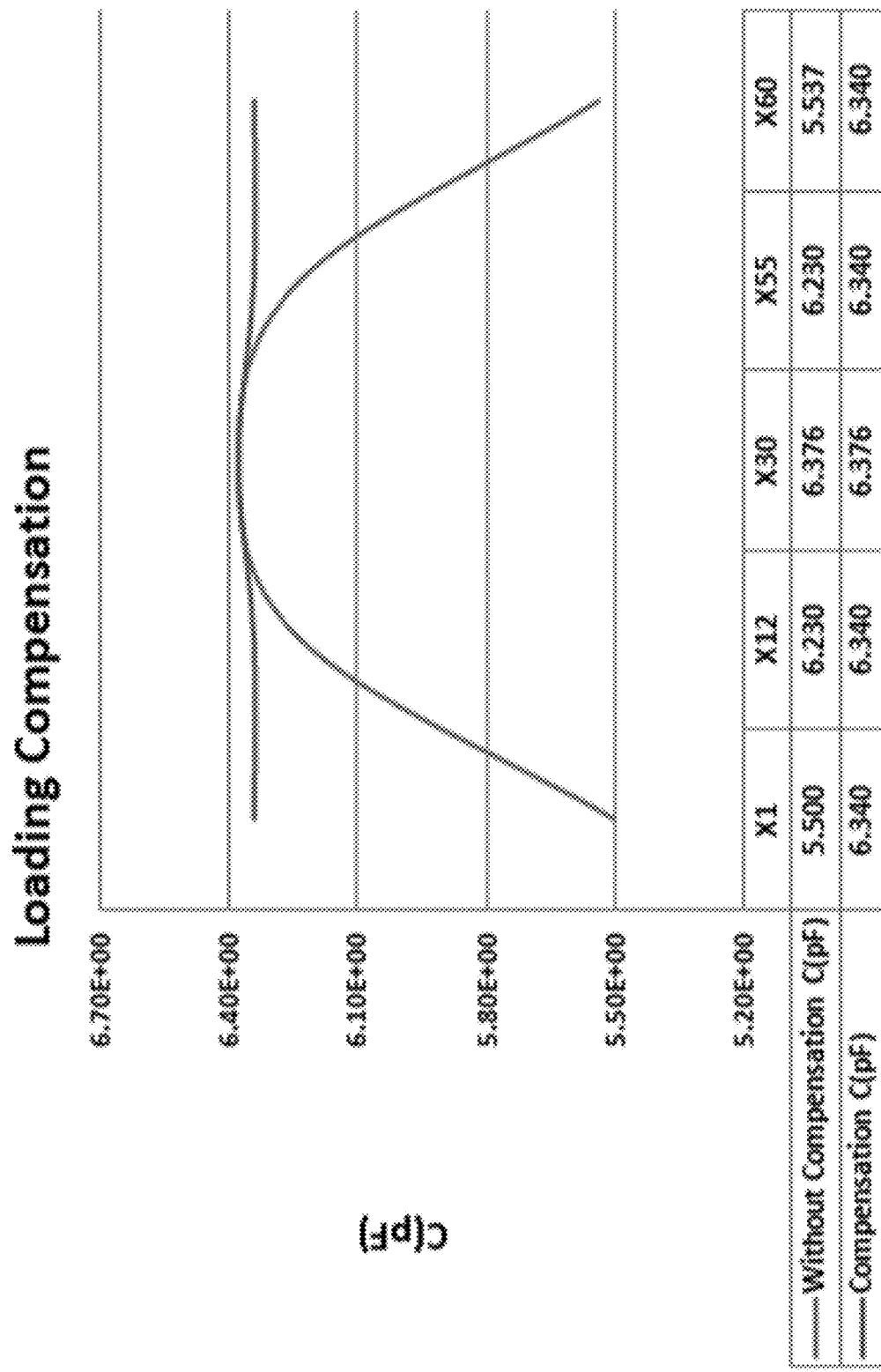
FIG. 12B shows a chart of the capacitance of the X scan lines using the compensation data as shown in FIG. 12A according to certain embodiments of the present disclosure.

FIG. 12A shows a chart of the compensation area of the X scan lines corresponding to a column of five receiver antennas according to certain embodiments of the present disclosure, where the winding number of each of the receiver antenna is N=12, and FIG. 12B shows a chart of the capacitance of the X scan lines using the compensation data as shown in FIG. 12A according to certain embodiments of the present disclosure. As shown in FIG. 12A, the widths of the crossover portions of the scan lines X1 to X60 can be adjusted such that the total crossover area for each of the X scan lines is 36000 $\mu m^2$ (=120*300 $\mu m^2$). In this case, as shown in FIG. 12B, the compensation structure would result in the capacitance of the X scan lines being in an even range of 6.340-6.376 pF.

Figure 12C:
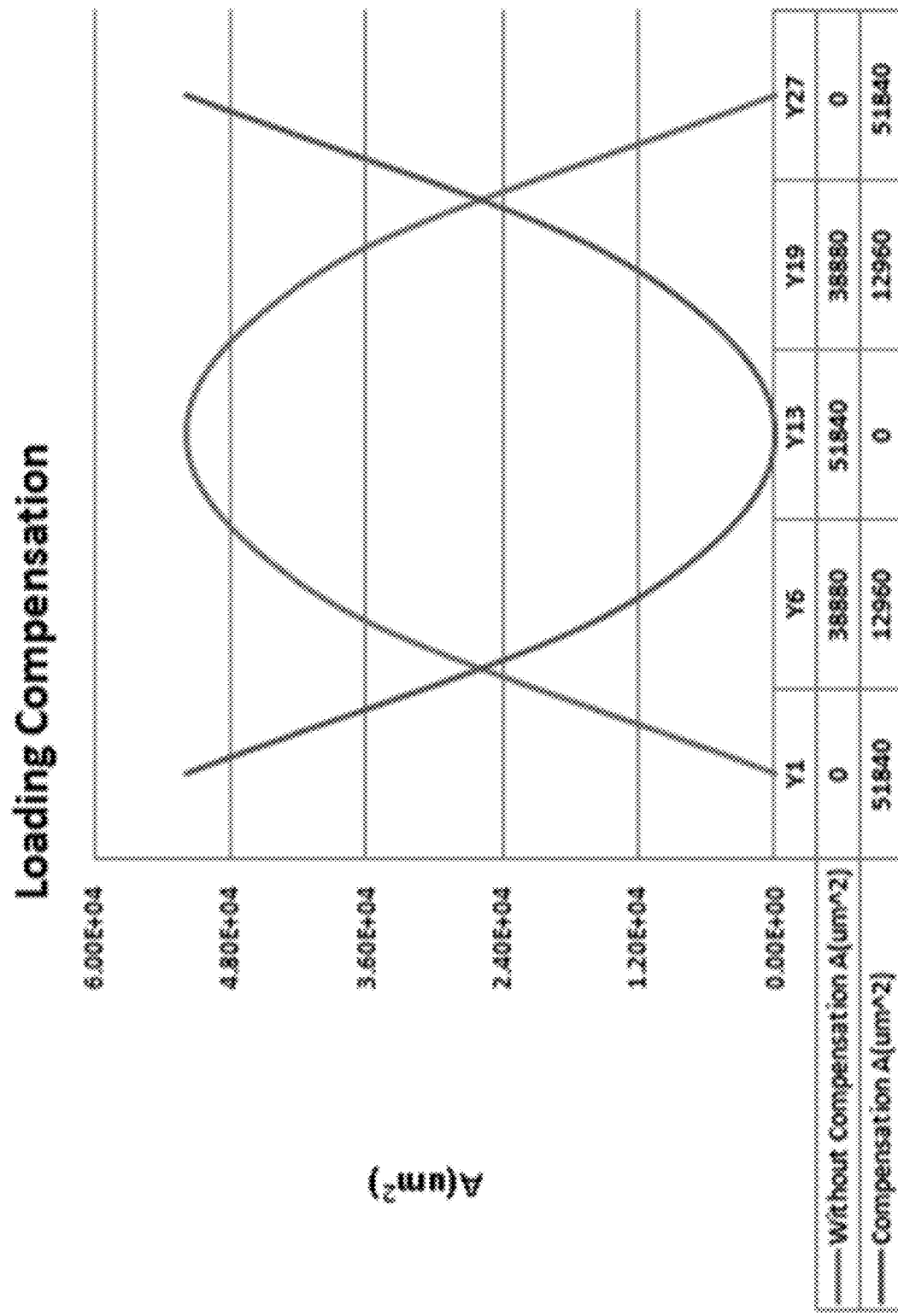
FIG. 12C shows a chart of the compensation area of the Y scan lines corresponding to a row of twelve receiver antennas according to certain embodiments of the present disclosure, where the winding number of each of the receiver antenna is N=12.
Figure 12D:
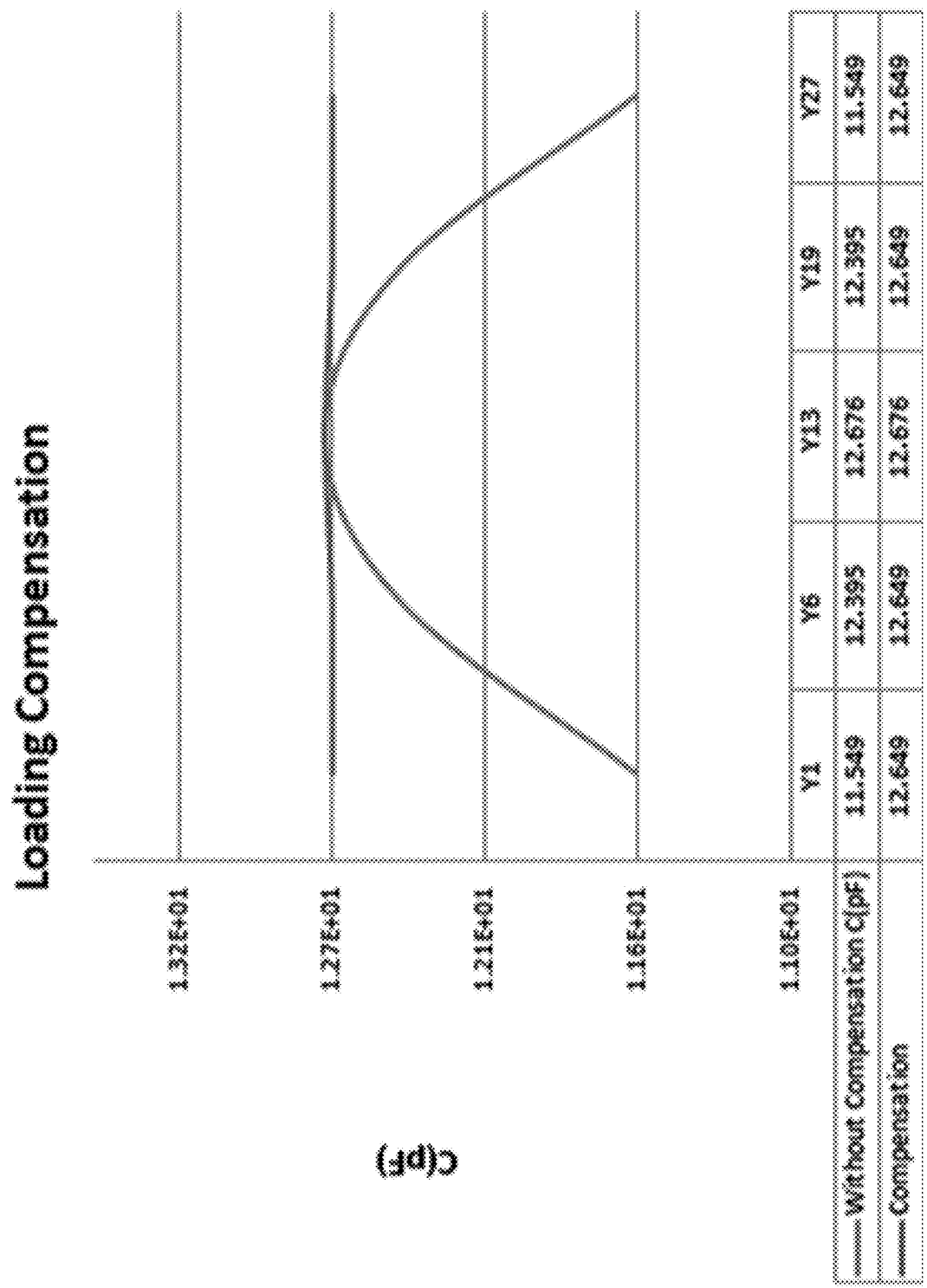
FIG. 12D shows a chart of the capacitance of the Y scan lines using the compensation data as shown in FIG. 12C according to certain embodiments of the present disclosure.

FIG. 12C shows a chart of the compensation area of the Y scan lines corresponding to a row of twelve receiver antennas according to certain embodiments of the present disclosure, where the winding number of each of the receiver antenna is N=12, and FIG. 12D shows a chart of the capacitance of the Y scan lines using the compensation data as shown in FIG. 12C according to certain embodiments of the present disclosure. As shown in FIG. 12C, the widths of the crossover portions of the scan lines Y1 to Y27 can be adjusted such that the total crossover area for each of the Y scan lines is 51840 $\mu m^2$ (=288*180 $\mu m^2$). In this case, as shown in FIG. 12D, the compensation structure would result in the capacitance of the Y scan lines being in an even range of 12.649-12.676 pF.

The embodiments of the display panel and display apparatus as described above are provided for the purposes of illustration and description. Although certain features may be described in different embodiments respectively, these features may be combined altogether to form other embodiments without departing from the spirit and scope of the disclosure.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display panel, comprising:
a pixel structure corresponding to a display area, comprising a plurality of pixels; and
a receiver antenna structure disposed on the pixel structure, configured to provide first signals to the pixels in a dot inversion driving mode, wherein the receiver antenna structure comprises a plurality of antenna blocks, each of the antenna blocks corresponds to M*N pixels of the pixels, the M*N pixels are disposed in M columns and N rows, and M and N are positive integers;
wherein each of the antenna blocks comprises:
an antenna, having an inner feeding end and an outer feeding end, wherein one of the inner feeding end and the outer feeding end functions as a feeding end, and the other of the inner feeding end and the outer feeding end is electrically connected to a direct voltage level to function as a reference end;
a first diode and a second diode electrically connected to the feeding end of the antenna in parallel, wherein the first diode and the second diode are disposed in opposite directions;
a first switch electrically connecting the first diode to the M*N pixels, wherein a control end of the first switch is electrically connected to a first clock pulse signal; and
a second switch electrically connecting the second diode to the M*N pixels, wherein a control end of the second switch is electrically connected to a second clock pulse signal phase-inversed from the first clock pulse signal;
wherein for each of the M*N pixels, in a first frame, the first switch is turned on and the second switch is turned off; and in a second frame, the first switch is turned off and the second switch is turned on.

2. The display panel of claim 1, wherein each of the antenna blocks further comprises a bridge structure electrically connecting the M*N pixels to the first switch and the second switch respectively, the bridge structure has a main line electrically connected to the first switch and the second switch respectively, and a plurality of branch lines extending from the main line along a row direction to be electrically connected to the M*N pixels.

3. The display panel of claim 1, further comprising a common electrode, wherein the reference end of the antenna of each of the antenna blocks is electrically connected to the common electrode to receive the direct voltage level from the common electrode.

4. The display panel of claim 3, further comprising a plurality of scan lines extending and crossing over the antennas of the antenna blocks, wherein the antennas of the antenna blocks have a plurality of antenna crossover areas overlapping with the scan lines in a vertical direction perpendicular to the pixel structure, and each of the scan lines has a crossover portion overlapping with the common electrode in the vertical direction, and a width of the crossover portion of each of the scan lines is greater than or equal to a width of a remaining portion of each of the scan lines.

5. The display panel of claim 4, wherein the scan lines comprise a first scan line corresponding to a first quantity of the antenna crossover areas and a second scan line corresponding to a second quantity of the antenna crossover areas, the second quantity is greater than the first quantity, and a width of the crossover portion of the first scan line is greater than a width of the crossover portion of the second scan line.

6. The display panel of claim 5, wherein the scan lines further comprise a third scan line corresponding to a third quantity of the antenna crossover areas, the third quantity is greater than the first quantity and less than the second quantity, and a width of the crossover portion of the third scan line is greater than the width of the crossover portion of the second scan line and is less than the width of the crossover portion of the first scan line.

7. The display panel of claim 4, wherein the width of the crossover portion of each of the scan lines is determined by a total crossover area of the antenna crossover areas corresponding to each of the scan lines.

8. The display panel of claim 4, wherein each of the pixels comprises a plurality of scan switches, and a control end of each of scan switches is electrically connected to a corresponding one of the scan lines.

9. The display panel of claim 1, further comprising a plurality of common electrodes, wherein the reference end of the antenna of each of the antenna blocks is electrically connected to one of the common electrodes, and each of the common electrodes is provided with a corresponding direct voltage level.

10. The display panel of claim 9, wherein two adjacent antenna blocks of the antenna blocks are electrically connected to two different ones of the common electrodes respectively.

11. The display panel of claim 1, further comprising a plurality of scan lines and a plurality of gate drivers electrically connected to the scan lines, wherein at least one of the gate drivers is disposed in the display area between two adjacent ones of the antenna blocks.

12. A display panel, comprising:
a pixel structure corresponding to a display area, comprising a plurality of pixels;
a receiver antenna structure disposed on the pixel structure, configured to provide first signals to the pixels, wherein the receiver antenna structure comprises a plurality of antennas;
a plurality of scan lines extending and crossing over the antennas, wherein the antennas have a plurality of antenna crossover areas overlapping with the scan lines in a vertical direction perpendicular to the pixel structure; and
a common electrode, wherein each of the scan lines has a crossover portion overlapping with the common electrode in the vertical direction;
wherein a width of the crossover portion of each of the scan lines is greater than or equal to a width of a remaining portion of each of the scan lines;
wherein the scan lines comprise a first scan line corresponding to a first quantity of the antenna crossover areas, a second scan line corresponding to a second quantity of the antenna crossover areas and a third scan line corresponding to a third quantity of the antenna crossover areas, the second quantity is greater than the first quantity, the third quantity is greater than the first quantity and less than the second quantity, a width of the crossover portion of the first scan line is greater than a width of the crossover portion of the second scan line, and a width of the crossover portion of the third scan line is greater than the width of the crossover portion of the second scan line and is less than the width of the crossover portion of the first scan line.

13. The display panel of claim 12, wherein the width of the crossover portion of each of the scan lines is determined by a total crossover area of the antenna crossover areas corresponding to each of the scan lines.

14. The display panel of claim 12, wherein for a center scan line of the scan lines corresponding to a maximum quantity of the antenna crossover areas, a width of the crossover portion of the center scan lines is equal to a width of a remaining portion of the center scan line.

15. The display panel of claim 12, wherein the common electrode comprises a plurality of strip portions disposed around the antennas, each of the strip portions has a plurality of overlapping portions corresponding to the crossover portions of the scan lines, and a width of each of the overlapping portions is greater than a width of a remaining portion of each of the strip portions.

16. The display panel of claim 12, wherein the scan lines comprise a plurality of X scan lines extending along a column direction and a plurality of Y scan lines extending along a row direction.

17. The display panel of claim 12, wherein the receiver antenna structure comprises a plurality of antenna blocks, each of the antenna blocks corresponds to M*N pixels of the pixels, the M*N pixels are disposed in M columns and N rows, M and N are positive integers, and each of the antenna blocks comprises:
a corresponding antenna of the antennas, the corresponding antenna having an inner feeding end and an outer feeding end, wherein one of the inner feeding end and the outer feeding end functions as a feeding end, and the other of the inner feeding end and the outer feeding end is electrically connected to the common voltage to receive a direct voltage level to function as a reference end;
a first diode and a second diode electrically connected to the feeding end of the corresponding antenna in parallel, wherein the first diode and the second diode are disposed in opposite directions;
a first switch electrically connecting the first diode to the M*N pixels, wherein a control end of the first switch is electrically connected to a first clock pulse signal; and
a second switch electrically connecting the second diode to the M*N pixels, wherein a control end of the second switch is electrically connected to a second clock pulse signal phase-inversed from the first clock pulse signal;
wherein for each of the M*N pixels, in a first frame, the first switch is turned on and the second switch is turned off; and in a second frame, the first switch is turned off and the second switch is turned on.

18. The display panel of claim 17, wherein each of the antenna blocks further comprises a bridge structure electrically connecting the M*N pixels to the first switch and the second switch respectively, the bridge structure has a main line electrically connected to the first switch and the second switch respectively, and a plurality of branch lines extending from the main line along a row direction to be electrically connected to the M*N pixels.

19. The display panel of claim 12, further comprising a plurality of gate drivers electrically connected to the scan lines, wherein at least one of the gate drivers is disposed in the display area between two adjacent ones of the antenna blocks.

20. A display panel, comprising:
- a pixel structure corresponding to a display area, comprising a plurality of pixels;
- a receiver antenna structure disposed on the pixel structure, configured to provide first signals to the pixels, wherein the receiver antenna structure comprises a plurality of antennas;
- a plurality of scan lines extending and crossing over the antennas, wherein the antennas have a plurality of antenna crossover areas overlapping with the scan lines in a vertical direction perpendicular to the pixel structure; and
- a common electrode, comprising a plurality of strip portions disposed around the antennas, wherein each of the scan lines has a crossover portion overlapping with the common electrode in the vertical direction;
- wherein a width of the crossover portion of each of the scan lines is greater than or equal to a width of a remaining portion of each of the scan lines;
- wherein the scan lines comprise a first scan line corresponding to a first quantity of the antenna crossover areas and a second scan line corresponding to a second quantity of the antenna crossover areas, the second quantity is greater than the first quantity, and a width of the crossover portion of the first scan line is greater than a width of the crossover portion of the second scan line;
- wherein each of the strip portions has a plurality of overlapping portions corresponding to the crossover portions of the scan lines, and a width of each of the overlapping portions is greater than a width of a remaining portion of each of the strip portions.

* * * * *